(12) United States Patent
Ito et al.

(10) Patent No.: US 11,540,393 B2
(45) Date of Patent: Dec. 27, 2022

(54) MULTILAYER SUBSTRATE, MULTILAYER SUBSTRATE MOUNTING STRUCTURE, METHOD OF MANUFACTURING MULTILAYER SUBSTRATE, AND METHOD OF MANUFACTURING ELECTRONIC DEVICE

(71) Applicant: Murata Manufacturing Co., Ltd., Nagaokakyo (JP)

(72) Inventors: Shingo Ito, Nagaokakyo (JP); Naoki Gouchi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 29 days.

(21) Appl. No.: 16/879,815

(22) Filed: May 21, 2020

(65) Prior Publication Data

US 2020/0288574 A1     Sep. 10, 2020

Related U.S. Application Data

(63) Continuation of application No. PCT/JP2018/041806, filed on Nov. 12, 2018.

(30) Foreign Application Priority Data

Nov. 30, 2017 (JP) .............................. JP2017-230616

(51) Int. Cl.
*H05K 1/14* (2006.01)
*H05K 1/11* (2006.01)
(Continued)

(52) U.S. Cl.
CPC .............. *H05K 1/144* (2013.01); *H05K 1/111* (2013.01); *H05K 3/368* (2013.01); *H05K 3/4644* (2013.01);
(Continued)

(58) Field of Classification Search
CPC ........ H05K 1/144; H05K 1/111; H05K 3/368; H05K 3/4644; H03H 1/00
(Continued)

(56) References Cited

U.S. PATENT DOCUMENTS

2007/0200462 A1    8/2007    Takano
2010/0175917 A1    7/2010    Miyasaka et al.
(Continued)

FOREIGN PATENT DOCUMENTS

JP    11-177223 A       7/1999
JP    2007-259410 A    10/2007
(Continued)

OTHER PUBLICATIONS

Official Communication issued in International Patent Application No. PCT/JP2018/041806, dated Feb. 12, 2019.

*Primary Examiner* — Tremesha S Willis
(74) *Attorney, Agent, or Firm* — Keating & Bennett, LLP

(57) ABSTRACT

A multilayer substrate includes a stacked body including a first main surface, and a conductor pattern (including a mounting electrode provided on the first main surface, and a first auxiliary pattern provided on the first main surface). The stacked body includes a plurality of insulating base material layers made of a resin as a main material and stacked on one another. The first auxiliary pattern is located adjacent to or in a vicinity of the mounting electrode. The mounting electrode, in a plan view of the first main surface (when viewed in the Z-axis direction), is interposed between a different conductor pattern (the mounting electrode) and the first auxiliary pattern.

21 Claims, 10 Drawing Sheets

(51) Int. Cl.
  *H05K 3/36* (2006.01)
  *H05K 3/46* (2006.01)
  *H03H 1/00* (2006.01)
  *H05K 1/02* (2006.01)
  *H05K 1/16* (2006.01)

(52) U.S. Cl.
  CPC ....... *H03H 1/00* (2013.01); *H03H 2001/0085* (2013.01); *H05K 1/0216* (2013.01); *H05K 1/162* (2013.01); *H05K 1/165* (2013.01); *H05K 2201/041* (2013.01)

(58) Field of Classification Search
  USPC ......................................................... 361/803
  See application file for complete search history.

(56) References Cited

U.S. PATENT DOCUMENTS

| | | |
|---|---|---|
| 2013/0093556 A1 | 4/2013 | Lim |
| 2014/0138136 A1 | 5/2014 | Ahn et al. |
| 2014/0266949 A1 | 9/2014 | Yokoyama |
| 2016/0012950 A1 | 1/2016 | Nishino et al. |
| 2017/0162317 A1 | 6/2017 | Taniguchi et al. |
| 2017/0179014 A1 | 6/2017 | Tago et al. |
| 2017/0365389 A1* | 12/2017 | Yosui .................... H01F 41/042 |
| 2018/0019054 A1 | 1/2018 | Tenno |
| 2018/0211765 A1 | 7/2018 | Nakaniwa et al. |
| 2018/0241126 A1 | 8/2018 | Nomura |

FOREIGN PATENT DOCUMENTS

| | | |
|---|---|---|
| JP | 2010-165855 A | 7/2010 |
| JP | 2013-084871 A | 5/2013 |
| JP | 2014-103371 A | 6/2014 |
| JP | 2014-207432 A | 10/2014 |
| JP | 2017-103354 A | 6/2017 |
| WO | 2015/079773 A1 | 6/2015 |
| WO | 2016/047446 A1 | 3/2016 |
| WO | 2016/163212 A1 | 10/2016 |
| WO | 2016/199516 A1 | 12/2016 |
| WO | 2017/082017 A1 | 5/2017 |
| WO | 2017/110460 A1 | 6/2017 |

* cited by examiner

MULTILAYER SUBSTRATE, MULTILAYER SUBSTRATE MOUNTING STRUCTURE, METHOD OF MANUFACTURING MULTILAYER SUBSTRATE, AND METHOD OF MANUFACTURING ELECTRONIC DEVICE

CROSS REFERENCE TO RELATED APPLICATIONS

This application claims the benefit of priority to Japanese Patent Application No. 2017-230616 filed on Nov. 30, 2017 and is a Continuation Application of PCT Application No. PCT/JP2018/041806 filed on Nov. 12, 2018. The entire contents of each application are hereby incorporated herein by reference.

BACKGROUND OF THE INVENTION

1. Field of the Invention

The present invention relates to a multilayer substrate, and more particularly to a multilayer substrate including a stacked body including a plurality of insulating base material layers made of a resin as a main material and stacked on one another, and an electrode provided on the stacked body. In addition, the present invention relates to a multilayer substrate mounting structure, and an electronic device including the multilayer substrate.

2. Description of the Related Art

Conventionally, various multilayer substrates including a stacked body obtained by stacking a plurality of insulating base material layers, and an electrode provided on the stacked body are known. For example, International Publication No. 2015/079773 discloses a multilayer substrate including a stacked body obtained by stacking a plurality of insulating base material layers made of a resin as a main material and stacked on one another, a coil provided in the stacked body, and an electrode provided on a surface of the stacked body.

However, when a stacked body is formed by heating and pressing the plurality of insulating base material layers that have been stacked on one another, the insulating base material layers made of a resin as a main material may flow, which may cause a positional shift of the electrode. In particular, a vicinity of a surface layer of the stacked body is easily affected by heat by a pressing machine at the time of heating and pressing, and an electrode provided on the surface of the stacked body tends to cause a positional shift. Therefore, in a case in which other mounted components are mounted on a multilayer substrate, or in a case in which a multilayer substrate is mounted on a different mounting substrate, a bonding failure or a positional shift of a mounting position may occur.

In contrast, in order to increase the positional accuracy of the electrode provided on the surface of the stacked body, it is conceivable to provide a large electrode on a surface of the stacked body, and to provide a protective film such as resist, on a surface of the stacked body so as to cause only a necessary portion of the electrode to be exposed. However, in such a case, a step of forming a protective film is necessary, which increases manufacturing steps.

SUMMARY OF THE INVENTION

Preferred embodiments of the present invention provide multilayer substrates in each of which a positional shift of an electrode when a stacked body is formed is significantly reduced or prevented while providing the electrode on a surface of the stacked body including a plurality of insulating base material layers made of a resin as a main material, and methods of manufacturing such multilayer substrates.

Preferred embodiments of the present invention also provide multilayer substrate mounting structures and methods of mounting multilayer substrates that significantly reduce or prevent a bonding failure, a positional shift of a mounting position, or the like, due to a positional shift of a mounting electrode.

A multilayer substrate according to a preferred embodiment of the present invention includes a stacked body including a plurality of insulating base material layers made of a resin as a main material and stacked on one another, and including a main surface, and a conductor pattern including a mounting electrode provided on the main surface, and a first auxiliary pattern provided on the main surface and located adjacent to or in a vicinity of the mounting electrode, and the mounting electrode, in a plan view of the main surface, is interposed between the first auxiliary pattern or a different conductor pattern, and the first auxiliary pattern, and three out of four directions of the mounting electrode are surrounded by the first auxiliary pattern, the four directions being perpendicular or substantially perpendicular to a radial direction from the mounting electrode.

In a case in which a stacked body is formed by stacking a plurality of insulating base material layers made of a resin as a main material, the mounting electrode positioned on a surface of the stacked body, in particular, easily causes a positional shift with a flow of the insulating base material layers at the time of heating and pressing. On the other hand, according to these features, the mounting electrode is interposed between a first auxiliary pattern and a different conductor pattern, so that an excessive flow of the insulating base material layers adjacent to or in a vicinity of the mounting electrode at the time of heating and pressing is significantly reduced or prevented, and a positional shift of the mounting electrode at the time of heating and pressing is significantly reduced or prevented. In addition, in a plan view of the main surface, three out of four directions of the mounting electrode are surrounded by the first auxiliary pattern, the four directions being perpendicular or substantially perpendicular to a radial direction from the mounting electrode. Accordingly, it is possible to further increase a significant reduction effect of the flow of the insulating base material layers adjacent to or in a vicinity of the mounting electrode by the first auxiliary pattern at the time of heating and pressing. Therefore, the positional shift of the mounting electrode at the time of heating and pressing is able to be further significantly reduced or prevented.

According to a preferred embodiment of the present invention, the first auxiliary pattern preferably includes a portion facing the mounting electrode, and the portion preferably has a shape along an outer shape of the mounting electrode. Accordingly, a flow of the insulating base material layers adjacent to or in a vicinity of the mounting electrode at the time of heating and pressing is significantly reduced or prevented, so that the positional shift of the mounting electrode at the time of heating and pressing is able to be significantly reduced or prevented.

According to a preferred embodiment of the present invention, an area of the first auxiliary pattern is preferably larger than an area of the mounting electrode. In general, a conductor pattern with a small area easily causes a positional shift due to a flow of the insulating base material layers at the time of heating and pressing. Therefore, the occurrence of a positional shift of the first auxiliary pattern itself at the time of heating and pressing is able to be significantly reduced or prevented.

According to a preferred embodiment of the present invention, a width of the first auxiliary pattern in a first direction that crosses the mounting electrode and the first auxiliary pattern is preferably larger than a width of the mounting electrode in the first direction. Accordingly, the occurrence of a positional shift of the first auxiliary pattern itself in the first direction at the time of heating and pressing is able to be significantly reduced or prevented. Therefore, the positional shift (the positional shift of the mounting electrode in the first direction, in particular) of the mounting electrode at the time of heating and pressing is significantly reduced or prevented.

According to a preferred embodiment of the present invention, a distance between the mounting electrode and the first auxiliary pattern in a first direction that crosses the mounting electrode and the first auxiliary pattern is preferably smaller than a width of the first auxiliary pattern in the first direction. As the first auxiliary pattern is located closer to the mounting electrode, a flow of the insulating base material layers at the time of heating and pressing is significantly reduced or prevented, and the positional shift of the mounting electrode is significantly reduced or prevented. Accordingly, the positional shift of the mounting electrode at the time of heating and pressing is able to be significantly reduced or prevented, compared to a case in which the distance between the mounting electrode and a first auxiliary pattern is large.

According to a preferred embodiment of the present invention, the mounting electrode, in the plan view of the main surface, preferably includes a portion partially surrounded by only the first auxiliary pattern. The structure of the mounting electrode interposed between the first auxiliary patterns adjacent to or in a vicinity of the mounting electrode, compared to the mounting electrode interposed between the first auxiliary pattern and a different conductor pattern, is able to significantly reduce or prevent a flow of the insulating base material layers adjacent to or in a vicinity of the mounting electrode at the time of heating and pressing. Therefore, the positional shift of the mounting electrode at the time of heating and pressing is able to be significantly reduced or prevented.

According to a preferred embodiment of the present invention, the conductor pattern preferably includes an inner layer pattern provided inside the stacked body, and a second auxiliary pattern provided inside the stacked body and surrounding the inner layer pattern in the plan view of the main surface. Accordingly, an excessive flow of the insulating base material layers inside the stacked body at the time of heating and pressing is able to be significantly reduced or prevented by the second auxiliary pattern. Therefore, a positional shift of the inner layer pattern at the time of heating and pressing is significantly reduced or prevented, and the change in stray capacitance or the change in characteristics due to the positional shift of the inner layer pattern is able to be significantly reduced or prevented.

According to a preferred embodiment of the present invention, the multilayer substrate preferably includes an interlayer connection conductor provided inside the stacked body, and the first auxiliary pattern and the second auxiliary pattern are connected to each other through the interlayer connection conductor. Accordingly, compared to a case in which the first auxiliary pattern and the second auxiliary pattern are not connected by the interlayer connection conductor, the positional shift of the first auxiliary pattern and the second auxiliary pattern at the time of heating and pressing is able to be further significantly reduced or prevented. Therefore, the positional shift of the mounting electrode and the inner layer pattern at the time of heating and pressing is able to be further significantly reduced or prevented.

According to a preferred embodiment of the present invention, the multilayer substrate may include a protective layer provided on the main surface, and the protective layer, in the plan view of the main surface, may not overlap with the first auxiliary pattern.

According to a preferred embodiment of the present invention, the four directions of the mounting electrode, in the plan view of the main surface, are surrounded by the first auxiliary pattern. Accordingly, compared to a case in which the three out of the four directions of the mounting electrode are surrounded by the first auxiliary pattern, a significant reduction effect of a flow of the insulating base material layers adjacent to or in a vicinity of the mounting electrode by the first auxiliary pattern at the time of heating and pressing is further increased.

According to a preferred embodiment of the present invention, the mounting electrode preferably includes a plurality of mounting electrodes, the first auxiliary pattern preferably includes a plurality of first auxiliary patterns, and the plurality of first auxiliary patterns are preferably located adjacent to or in a vicinity of different mounting electrodes, respectively. In a case in which one first auxiliary pattern is adjacent to or in a vicinity of a plurality of mounting electrodes, and short-circuiting between the one first auxiliary pattern and each of the plurality of mounting electrodes occurs, short-circuiting between the plurality of mounting electrodes occurs. On the other hand, according to the above-described features, even when the short-circuiting between each of the plurality of mounting electrodes and the first auxiliary pattern occurs, a possibility that the short-circuiting between the plurality of mounting electrodes through the first auxiliary pattern occurs is low.

A multilayer substrate mounting structure according to a preferred embodiment of the present invention includes a multilayer substrate, and a mounting substrate on which the multilayer substrate is mounted, the mounting substrate including a mounting surface and a bonding electrode on the mounting surface; the multilayer substrate includes a stacked body including a plurality of insulating base material layers made of a resin as a main material and stacked on one another, and including a main surface, and a conductor pattern including a mounting electrode provided on the main surface, and a first auxiliary pattern provided on the main surface and located adjacent to or in a vicinity of the mounting electrode; the mounting electrode, in a plan view of the main surface, is interposed between the first auxiliary pattern or a different conductor pattern, and the first auxiliary pattern; three out of four directions of the mounting electrode are surrounded by the first auxiliary pattern, the four directions being perpendicular or substantially perpendicular to a radial direction from the mounting electrode; the first auxiliary pattern is not electrically connected to the bonding electrode; and the mounting electrode is electrically connected to the bonding electrode.

Accordingly, a multilayer substrate mounting structure that significantly reduces or prevents a bonding failure, a positional shift of a mounting position, or the like, due to the positional shift of the mounting electrode, is able to be provided.

According to a preferred embodiment of the present invention, the mounting substrate preferably includes a portion of the mounting surface on which the bonding electrode is provided, the portion is preferably a convex portion protruding farther than other portions, the mounting electrode and the bonding electrode preferably face each other, and the multilayer substrate and the mounting substrate are preferably connected to each other while interposing an insulating anisotropic conductive film between the multilayer substrate and the mounting substrate. Accordingly, a portion of the insulating anisotropic conductive film interposed between the mounting electrode and the bonding electrode is electrically conducted by the pressure applied when the mounting substrate, the insulating anisotropic conductive film, and the multilayer substrate are stacked and pressurized. Therefore, it is easy to electrically connect the mounting electrode and the bonding electrode.

A method of manufacturing a multilayer substrate according to a preferred embodiment of the present invention is a method of manufacturing a multilayer substrate including a stacked body including a plurality of insulating base material layers made of a resin as a main material and stacked on one another, and including a main surface; and a conductor pattern including a mounting electrode provided on the main surface; and a first auxiliary pattern provided on the main surface, the method includes a conductor pattern forming step of forming the mounting electrode, and the first auxiliary pattern located adjacent to or in a vicinity of the mounting electrode, on a surface of an insulating base material layer defining and functioning as the main surface, among the plurality of insulating base material layers; and a stacked body forming step of forming the stacked body by stacking the plurality of insulating base material layers and heating and pressing the stacked insulating base material layers, after the conductor pattern forming step; the mounting electrode is interposed between the first auxiliary pattern or a different conductor pattern, and the first auxiliary pattern; and three out of four directions of the mounting electrode are surrounded by the first auxiliary pattern, the four directions being perpendicular or substantially perpendicular to a radial direction from the mounting electrode.

According to the manufacturing method, a multilayer substrate that significantly reduces or prevents the positional shift of the mounting electrode at the time of forming the stacked body is able to be easily manufactured.

A method of manufacturing an electronic device according to a preferred embodiment of the present invention is a method of manufacturing an electronic device including a multilayer substrate, and a mounting substrate including a mounting surface and a bonding electrode on the mounting surface, the multilayer substrate includes a stacked body including a plurality of insulating base material layers made of a resin as a main material and stacked on one another, and including a main surface; and a conductor pattern including a mounting electrode provided on the main surface; and a first auxiliary pattern provided on the main surface and located adjacent to or in a vicinity of the mounting electrode; the mounting electrode, in a plan view of the main surface, is interposed between the first auxiliary pattern or a different conductor pattern, and the first auxiliary pattern; three out of four directions of the mounting electrode are surrounded by the first auxiliary pattern, the four directions being perpendicular or substantially perpendicular to a radial direction from the mounting electrode, and the method includes an anisotropic element placing step of placing an insulating anisotropic conductive film on a surface of the bonding electrode being a convex portion protruding farther than at least other portions of the mounting surface; a multilayer substrate placing step of stacking the multilayer substrate on the mounting surface of the mounting substrate so that the mounting electrode may face the bonding electrode while interposing the insulating anisotropic conductive film between the multilayer substrate and the mounting substrate, after the anisotropic element placing step; and a heating and pressing step of heating and pressing the multilayer substrate and the mounting substrate in a direction in which the multilayer substrate and the mounting substrate are stacked on each other and electrically connecting the mounting electrode and the bonding electrode, after the multilayer substrate placing step.

According to the manufacturing method, it is possible to easily provide an electronic device in which a bonding failure, a positional shift of a mounting position, or the like, due to the positional shift of the mounting electrode, is significantly reduced or prevented when the multilayer substrate is mounted on the mounting substrate.

According to preferred embodiments of the present invention, in multilayer substrates in each of which an electrode is provided on a surface of a stacked body including a plurality of insulating base material layers made of a resin as a main material, the multilayer substrate that significantly reduces or prevents a positional shift of the electrode at the time of forming the stacked body is able to be provided.

In addition, according to preferred embodiments of the present invention, structures in each of which a multilayer substrate including an electrode provided on a surface of a stacked body including a plurality of insulating base material layers made of a resin as a main material is mounted with respect to a different substrate is able to be provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1A:
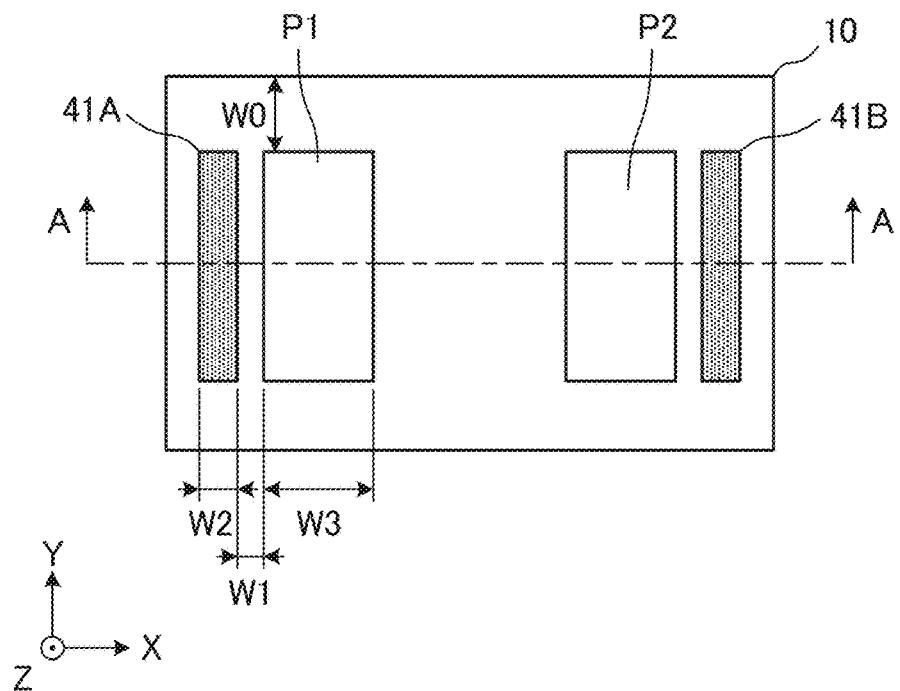
FIG. 1A is a plan view of a multilayer substrate 101 according to a first preferred embodiment of the present invention.

Hereinafter, preferred embodiments of the present invention will be described in detail with reference to the attached drawings and several specific examples. In the drawings, components and elements assigned with the same reference numerals or symbols will represent identical or substantially identical components and elements. While preferred embodiments of the present invention are divided and described for the sake of convenience in consideration of ease of description or understanding of main points, elements described in different preferred embodiments are able to be partially replaced and combined with each other. In the second and subsequent preferred embodiments, a description of matters common to the first preferred embodiment will be omitted and only different points will be described. In particular, the same or similar advantageous functions and effects by the same or similar configurations and features will not be described one by one for each preferred embodiment.

First Preferred Embodiment

Figure 1B:
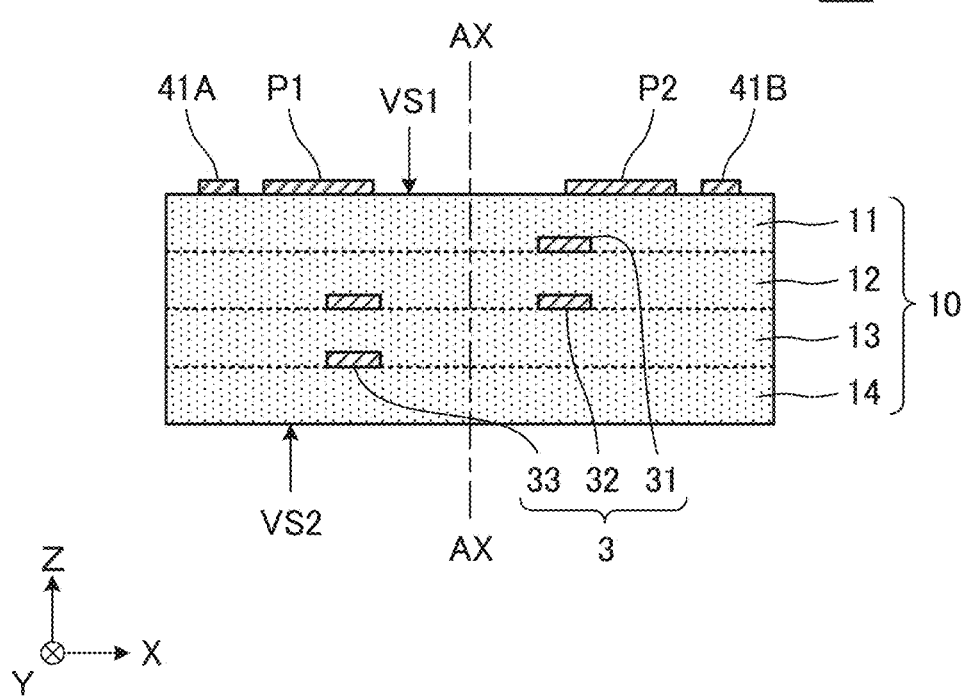
FIG. 1B is an A-A cross-sectional view in FIG. 1A.
Figure 2:
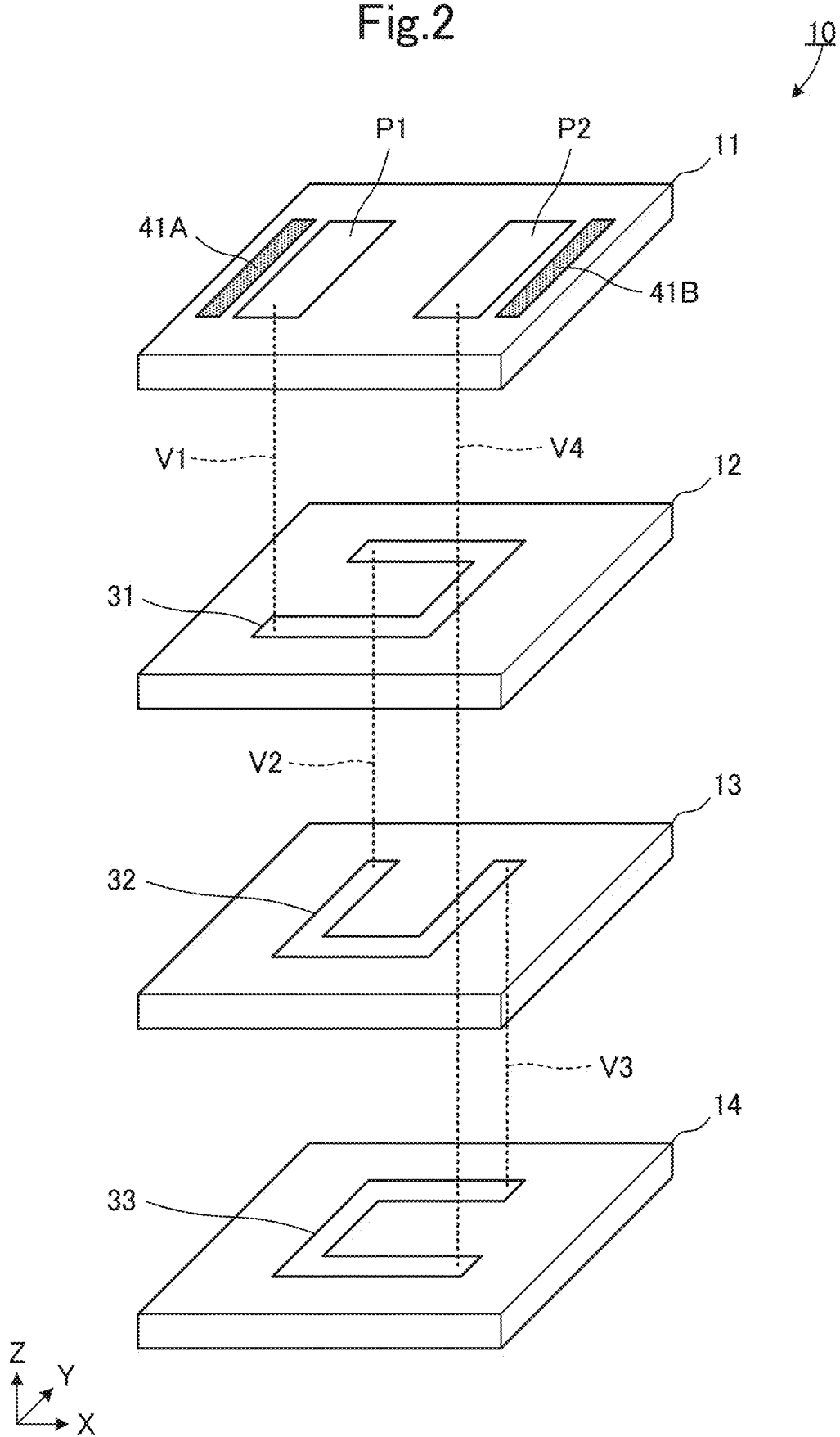
FIG. 2 is an exploded perspective view of a stacked body 10 included in the multilayer substrate 101.

FIG. 1A is a plan view of a multilayer substrate 101 according to a first preferred embodiment of the present invention, and FIG. 1B is an A-A cross-sectional view in FIG. 1A. FIG. 2 is an exploded perspective view of a stacked body 10 included in the multilayer substrate 101. In FIG. 1A and FIG. 2, in order to make the structure easy to understand, first auxiliary patterns 41A and 41B are indicated by a dot pattern.

The multilayer substrate 101 includes a stacked body 10, a conductor pattern (mounting electrodes P1 and P2, first auxiliary patterns 41A and 41B, coil conductors 31, 32, and 33), and interlayer connection conductors V1, V2, V3, and V4.

The stacked body 10 is an insulator having a rectangular parallelepiped shape or a substantially rectangular parallelepiped shape of which the longitudinal direction coincides with an X-axis direction, and includes a first main surface VS1 and a second main surface VS2 that face each other. The mounting electrodes P1 and P2 are conductor patterns provided on the first main surface VS1 of the stacked body 10. The first auxiliary patterns 41A and 41B are conductor patterns provided on the first main surface VS1 and located adjacent to or in a vicinity of the mounting electrodes P1 and P2. The coil conductors 31, 32, and 33 are conductor patterns provided inside the stacked body 10. The mounting electrodes P1 and P2, the first auxiliary patterns 41A and 41B, and the coil conductors 31, 32, and 33 are conductor patterns preferably made of a material such as Cu, for example.

In the first preferred embodiment, the coil conductors 31, 32, and 33 correspond to the "inner layer patterns". In addition, the description of "located adjacent to or in a vicinity of the mounting electrodes" means that the first auxiliary patterns are located adjacent to or in a vicinity of the mounting electrodes at a distance smaller than the shortest distance (W0) from the outer shape of the mounting electrode to the outer edge of the stacked body 10, in a plan view of the first main surface VS1 (when viewed in a Z-axis direction). In other words, in a case in which a distance (W1) between the first auxiliary pattern and the mounting electrode, when viewed in the Z-axis direction, is smaller than the shortest distance (W0) from the outer shape of the mounting electrode to the outer edge of the stacked body (for example, a case in which the distance W1 between the mounting electrode P1 and the first auxiliary pattern 41A shown in FIG. 1A and the shortest distance W0 from the outer shape of the mounting electrode P1 to the outer edge of the stacked body 10 satisfy the relationship of W1<W0), the first auxiliary pattern is defined to be "located adjacent to or in a vicinity of the mounting electrode."

As shown in FIG. 2, the stacked body 10 includes a plurality of insulating base material layers 14, 13, 12, and 11 made of a resin as a main material and stacked in this order. Each of the plurality of insulating base material layers 11, 12, 13, and 14 is a rectangular flat plate or a substantially rectangular flat plate that has flexibility. The plurality of insulating base material layers 11, 12, 13, and 14 are preferably thermoplastic resin sheets including a liquid crystal polymer (LCP) or a polyether ether ketone (PEEK), for example, as a main material.

The mounting electrodes P1 and P2 and the first auxiliary patterns 41A and 41B are provided on a surface of the insulating base material layer 11. The mounting electrodes P1 and P2 are rectangular or substantially rectangular conductor patterns of which the longitudinal direction coincides with a Y-axis direction. The first auxiliary patterns 41A and 41B are linear or substantially linear conductor patterns extending in the Y-axis direction. The mounting electrode P1 and the first auxiliary pattern 41A are located adjacent to or in a vicinity of a first side (a left side of the insulating base material layer 11 in FIG. 2) of the insulating base material layer 11. The mounting electrode P2 and the first auxiliary pattern 41B are located adjacent to or in a vicinity of a second side (a right side of the insulating base material layer 11 in FIG. 2) of the insulating base material layer 11. It is to be noted that the first auxiliary patterns 41A and 41B are dummy patterns. The "dummy pattern" used herein refers to a pattern that does not have a main function on a circuit, such as a conductor pattern that is not electrically connected to the mounting electrode, for example.

The coil conductor 31 is provided on a surface of the insulating base material layer 12. The coil conductor 31 is a rectangular or substantially rectangular loop-shaped conductor pattern of about 0.75 turn wound along the outer periphery of the insulating base material layer 12.

The coil conductor 32 is provided on a surface of the insulating base material layer 13. The coil conductor 32 is a rectangular or substantially rectangular loop-shaped conductor pattern of about 0.75 turn wound along the outer periphery of the insulating base material layer 13.

The coil conductor 33 is provided on a surface of the insulating base material layer 14. The coil conductor 33 is a rectangular or substantially rectangular loop-shaped conductor pattern of about 0.75 turn wound along the outer periphery of the insulating base material layer 14.

As shown in FIG. 2, the mounting electrode P1 is connected to one end of the coil conductor 31 through the interlayer connection conductor V1 provided in the insulating base material layer 11. The other end of the coil conductors 31 is connected to one end of the coil conductor 32 through the interlayer connection conductor V2 provided in the insulating base material layer 12. The other end of the coil conductors 32 is connected to one end of the coil conductor 33 through the interlayer connection conductor V3 provided in the insulating base material layer 13. The other end of the coil conductors 33 is connected to the mounting electrode P2 through the interlayer connection conductor V4 provided in the insulating base material layers 11, 12, and 13.

Accordingly, the coil conductors 31, 32, and 33 and the interlayer connection conductors V2 and V3 define a coil 3 having a rectangular helical shape or a substantially rectangular helical shape of more than about two turns. The coil 3 is provided in contact with the stacked body 10, and includes a winding axis AX in the stacking direction (the Z-axis direction) of the plurality of insulating base material layers 11, 12, 13, and 14. In addition, one end of the coil 3 is connected to the mounting electrode P1, and the other end of the coil 3 is connected to the mounting electrode P2.

As shown in FIG. 1A, the first auxiliary patterns 41A and 41B are located adjacent to or in a vicinity of different mounting electrodes, respectively. Specifically, the first auxiliary pattern 41A is located adjacent to or in a vicinity of the mounting electrode P1, and the first auxiliary pattern 41B is located adjacent to or in a vicinity of the mounting electrode P2.

In addition, a portion (a right side of the first auxiliary pattern 41A in FIG. 1A) of the first auxiliary pattern 41A that faces the mounting electrode P1 has a shape along the outer shape of the mounting electrode P1. Similarly, a portion (a left side of the first auxiliary pattern 41B in FIG. 1A) of the first auxiliary pattern 41B that faces the mounting electrode P2 has a shape along the outer shape of the mounting electrode P2.

It is to be noted that the "shape along the outer shape of the mounting electrode" means that the portion (the outer shape) of the first auxiliary pattern that faces the mounting electrode and the outer shape of the mounting electrode are approximately similar to each other. More specifically, the description of "a portion of the first auxiliary pattern that faces the mounting electrode has a shape along the outer shape of the mounting electrode" means, for example, that an angle between the portion (the outer shape) of the first auxiliary pattern that faces the mounting electrode and the outer shape of the mounting electrode is in a range from about minus 30 degrees to about plus 30 degrees.

In addition, the mounting electrode P1, in a plan view of the first main surface VS1 (when viewed in the Z-axis direction), is interposed between the first auxiliary pattern 41A and a different conductor pattern (a conductor pattern other than the first auxiliary pattern: the mounting electrode P2) in the X-axis direction. In addition, the mounting electrode P2, when viewed in the Z-axis direction, is interposed between the first auxiliary pattern 41B and a different conductor pattern (the mounting electrode P1) in the X-axis direction.

As shown in FIG. 1A, the distance (W1) between the mounting electrode P1 and the first auxiliary pattern 41A in the first direction (the X-axis direction, for example) that crosses the mounting electrode P1 and the first auxiliary pattern 41A is smaller than a width (W2) of the first auxiliary pattern 41A in the first direction (the X-axis direction). In addition, a distance between the mounting electrode P2 and the first auxiliary pattern 41B in the first direction is smaller than a width of the first auxiliary pattern 41B in the first direction (not shown).

According to the multilayer substrate 101 of the first preferred embodiment of the present invention, the following advantageous effects are obtained.

(a) In a case in which a plurality of insulating base material layers made of a resin as a main material are stacked to define a stacked body, the insulating base material layers may flow due to heat generated when the stacked insulating base material layers are heated and pressed, which may cause a positional shift of a conductor pattern provided on the stacked body. In particular, a vicinity of the surface of the stacked body is easily affected by heat by a pressing machine at the time of heating and pressing, and a flow of the insulating base material layers is easily greater in the vicinity than the inside of the stacked body. Therefore, with the flow of the insulating base material layers at the time of heating and pressing, the mounting electrode positioned on the surface of the stacked body, in particular, easily causes a positional shift. On the other hand, in the first preferred embodiment, the first auxiliary patterns 41A and 41B located adjacent to or in a vicinity of the mounting electrodes P1 and P2 are provided, and the mounting electrode is interposed between the first auxiliary pattern and a different conductor pattern. According to the above-described features, an excessive flow of the insulating base material layers adjacent to or in a vicinity of the mounting electrodes P1 and P2 at the time of heating and pressing is significantly reduced or prevented, so that a positional shift of the mounting electrodes P1 and P2 at the time of heating and pressing is able be significantly reduced or prevented. Therefore, in a case in which the multilayer substrate is mounted on the mounting substrate or a suitable component, a bonding failure, a positional shift of a mounting position, or the like, due to the positional shift of the mounting electrode, is able to be significantly reduced or prevented.

In addition, as the first preferred embodiment, the stress is easily concentrated on a portion in which the inner layer patterns (the coil conductors 31, 32, and 33) provided on each of the plurality of insulating base material layers 12, 13, and 14 overlap with each other in the stacking direction (the Z-axis direction), at the time of heating and pressing. In short, the uneven stress is applied to an overlapping portion in which the plurality of inner layer patterns overlap with each other in the stacking direction and a portion other than the overlapping portion at the time of heating and pressing, so that the flow of the insulating base material layers is easily caused. Therefore, as the first preferred embodiment, in a case in which the mounting electrodes P1 and P2 and the plurality of inner layer patterns overlap with each other in the stacking direction (see FIG. 1B), the positional shift of the mounting electrode, in particular, is easily caused. Accordingly, the advantageous functions and effects by the above-described features are particularly effective in the case in which the mounting electrodes and the plurality of inner layer patterns overlap with each other in the stacking direction.

(b) In addition, in the first preferred embodiment, the portion of the first auxiliary pattern 41A that faces the mounting electrode P1 has a shape along the outer shape of the mounting electrode P1. In addition, the portion of the first auxiliary pattern 41B that faces the mounting electrode P2 has a shape along the outer shape of the mounting electrode P2. According to the above-described features, a flow of the insulating base material layers adjacent to or in a vicinity of the mounting electrodes P1 and P2 at the time of heating and pressing is significantly reduced or prevented, so that a positional shift of the mounting electrodes P1 and P2 at the time of heating and pressing is able to be significantly reduced or prevented.

(c) In the first preferred embodiment, the distance (W1) between the mounting electrode P1 and the first auxiliary pattern 41A in the first direction (the X-axis direction, for example) is smaller than the width (W2) of the first auxiliary pattern 41A in the first direction. In addition, the distance between the mounting electrode P2 and the first auxiliary pattern 41B in the first direction is smaller than the width of the first auxiliary pattern 41B in the first direction. As the first auxiliary pattern is located closer to the mounting electrode, the flow of the insulating base material layers at the time of heating and pressing is more significantly reduced or prevented, and the positional shift of the mounting electrode is more significantly reduced or prevented. Therefore, according to the above-described features, the positional shift of the mounting electrode at the time of heating and pressing is able to be significantly reduced or prevented, compared to a case in which the distance between the mounting electrode and the first auxiliary pattern is large.

It is to be noted that while the "first direction" indicates the X-axis direction in the first preferred embodiment, the present invention is not limited to such a structural arrangement. The "first direction" may be a direction other than the X-axis direction as long as the direction crosses the mounting electrode and the first auxiliary pattern on a straight line. The "first direction" may be a direction inclined at about 20 degrees on the X-Y plane with respect to the X-axis direction, for example, or may be the Y-axis direction, for example.

(d) In the first preferred embodiment, the stacked body 10 includes a plurality of insulating base material layers that include a thermoplastic resin and are stacked on one another. Accordingly, as will be described below, since the stacked body 10 is able to be easily formed by collectively pressing the stacked insulating base material layers, the number of manufacturing steps of the multilayer substrate 101 is reduced, and the cost is able to be reduced to a low level. In addition, a multilayer substrate that is able to be easily plastically deformed and that maintains (holds) a predetermined shape is able to be provided.

(e) In addition, in the first preferred embodiment, the plurality of first auxiliary patterns 41A and 41B are located adjacent to or in a vicinity of different mounting electrodes P1 and P2, respectively. In a case in which one first auxiliary pattern is located adjacent to or in a vicinity of a plurality of mounting electrodes (see a multilayer substrate 104 according to a fourth preferred embodiment or a multilayer substrate 105 according to a fifth preferred embodiment to be described below), when short-circuiting between the one first auxiliary pattern and each of the plurality of mounting electrodes occurs, short-circuiting between the plurality of mounting electrodes occurs. On the other hand, according to the above-described features, even when the short-circuiting between each of the mounting electrodes and the first auxiliary pattern occurs, a possibility that the short-circuiting between the plurality of mounting electrodes through the first auxiliary pattern occurs is low.

The multilayer substrate 101 according to the first preferred embodiment is manufactured by, for example, the following manufacturing method.

(1) First, a plurality of insulating base material layers 11, 12, 13, and 14 made of a resin as a main material are prepared, and a conductor pattern (the mounting electrodes P1 and P2, the first auxiliary patterns 41A and 41B, and coil conductors 31, 32, and 33) is provided on each of the plurality of insulating base material layers 11, 12, 13, and 14. The insulating base material layers 11, 12, 13, and 14 are thermoplastic resin sheets made of polyimide (PI) or a liquid crystal polymer (LCP), for example, as a main material.

Specifically, a metal foil (a Cu foil, for example) is preferably laminated on one of the main surfaces of the insulating base material layers 11, 12, 13, and 14 in a collective substrate state, and the metal foil is patterned by photolithography, for example. With the above structure, the mounting electrodes P1 and P2 and the first auxiliary patterns 41A and 41B are provided on the surface of the insulating base material layer 11, the coil conductor 31 is provided on the surface of the insulating base material layer 12, the coil conductor 32 is provided on the surface of the insulating base material layer 13, and the coil conductor 33 is provided on the surface of the insulating base material layer 14.

Accordingly, a step of forming the mounting electrodes P1 and P2 and the first auxiliary patterns 41A and 41B on the surface (the surface of the insulating base material layer as the first main surface of the stacked body) of the insulating base material layer 11 is an example of the "conductor pattern forming step".

In addition, the plurality of insulating base material layers 11, 12, and 13 include interlayer connection conductors V1, V2, V3, and V4, respectively. The interlayer connection conductors V1, V2, V3, and V4 are provided by forming a through hole in the insulating base material layers 11 to 13 with a laser or any other suitable method, for example, then providing the through hole with a conductive paste preferably including, for example, one or more of Cu, Sn, and the like or an alloy including one or more of Cu, Sn, and the like, and then curing the conductive paste through the subsequent heating and pressing. Therefore, the interlayer connection conductors V1 to V4 are preferably made of a material having a melting point (a melting temperature) lower than the temperature of the subsequent heating and pressing, for example.

(2) Next, the insulating base material layers 14, 13, 12, and 11 are stacked in this order. Subsequently, the stacked insulating base material layers 11 to 14 are heated and pressed (collectively pressed) in a stacking direction (the Z-axis direction) in which the plurality of insulating base material layers 11, 12, 13, and 14 are stacked to form a stacked body 10 in the collective substrate state.

Accordingly, a step of forming a stacked body 10 by stacking the plurality of insulating base material layers 11 to 14 and heating and pressing the stacked insulating base material layers 11 to 14 after the "conductor pattern forming step" is an example of the "stacked body forming step".

According to the manufacturing method, a multilayer substrate that significantly reduces or prevents the positional shift of the mounting electrode at the time of forming the stacked body is able to be easily manufactured.

In addition, according to the manufacturing method, the stacked body 10 is able to be easily formed by collectively pressing the stacked insulating base material layers 11, 12, 13, and 14. Therefore, the number of steps of manufacturing the multilayer substrate 101 is reduced, and the cost is able to be reduced to a low level.

Figure 3:
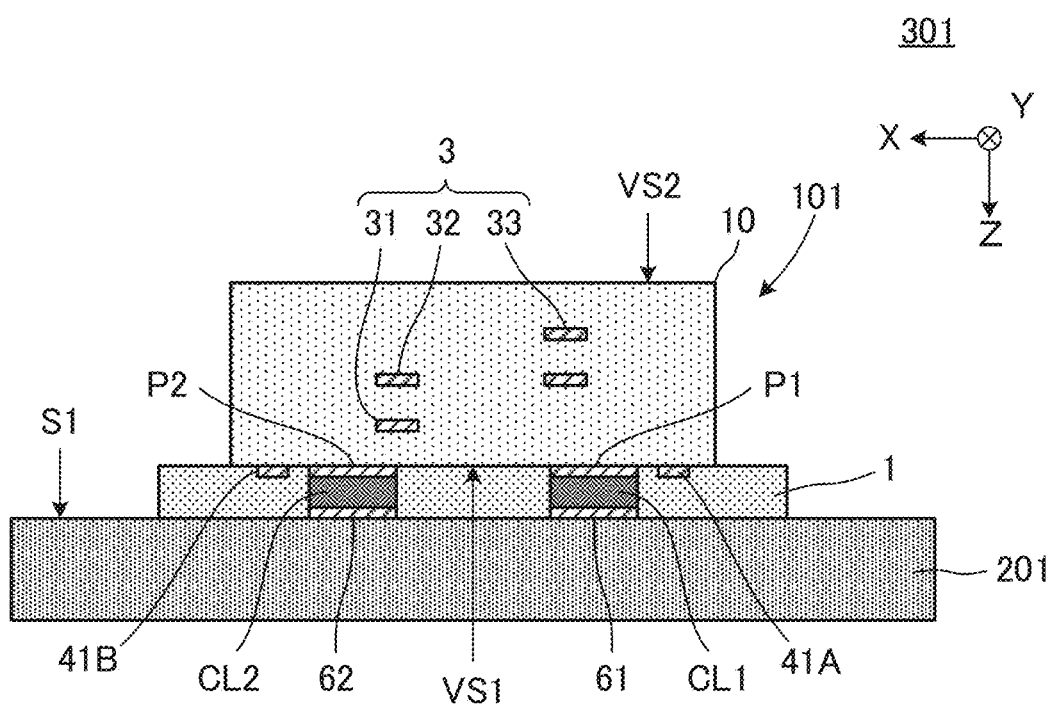
FIG. 3 is a cross-sectional view showing a portion in which the multilayer substrate 101 and a mounting substrate 201 are bonded, the portion being included in an electronic device 301 according to the first preferred embodiment of the present invention.

Subsequently, a structure in which a multilayer substrate 101 is mounted, and an electronic device including the multilayer substrate 101 will be described with reference to the drawings. FIG. 3 is a cross-sectional view showing a portion in which the multilayer substrate 101 and a mounting substrate 201 are bonded, the portion being included in an electronic device 301 according to the first preferred embodiment.

The electronic device 301 includes a multilayer substrate 101, a mounting substrate 201, and an insulating anisotropic conductive film 1. The multilayer substrate 101 and other components are mounted on a mounting surface S1 of the mounting substrate 201. Other chip components and the like are also mounted on the mounting surface S1 of the mounting substrate 201, although the illustration is omitted. As shown in FIG. 3, the first main surface VS1 of the multilayer substrate 101 faces the mounting surface S1 of the mounting substrate 201 while interposing the insulating anisotropic conductive film 1 between the multilayer substrate 101 and the mounting substrate 201. The mounting substrate 201 is preferably a glass epoxy substrate, for example.

The insulating anisotropic conductive film (Anisotropic Conductive Film: ACF) 1 is provided by forming, into a film shape, a semi-cured prepreg resin sheet in which fine conductive particles are dispersed. The insulating anisotropic conductive film 1 has conductivity in a thickness direction at a portion to which a pressure greater than or equal to a predetermined pressure is applied at the time of pressurizing and of which the film thickness is reduced.

A plurality of bonding electrodes 61 and 62 are provided on the mounting surface S1 of the mounting substrate 201. A portion of the mounting surface S1 of the mounting substrate 201, the portion including the bonding electrodes 61 and 62, is a convex portion protruding farther than other portions. In addition, a portion of the first main surface VS1 of the stacked body 10, the portion including the mounting electrodes P1 and P2 and the first auxiliary patterns 41A and 41B, is a convex portion protruding farther than other portions. As shown in FIG. 3, the mounting electrode P1 and the bonding electrode 61 face each other, and the mounting electrode P2 and the bonding electrode 62 face each other.

The multilayer substrate 101 and the mounting substrate 201 are connected to each other while interposing the insulating anisotropic conductive film 1 between the multilayer substrate 101 and the mounting substrate 201. Specifically, the mounting electrode P1 is electrically connected to the bonding electrode 61 through a connection conductor CL1, and the mounting electrode P2 is electrically connected to the bonding electrode 62 through a connection conductor CL2. The connection conductor CL1 is a portion interposed between the mounting electrode (a portion projecting from the first main surface VS1) P1 and the bonding electrode (a portion projecting from the mounting surface S1) 61 and electrically conducted when the insulating anisotropic conductive film 1 is partially pressurized. The connection conductor CL2 is a portion interposed between the mounting electrode P2 and the bonding electrode 62 and electrically conducted when the insulating anisotropic conductive film 1 is partially pressurized.

According to the electronic device 301 (the structure in which the multilayer substrate 101 is mounted) according to the first preferred embodiment of the present invention, the following advantageous effects are obtained.

(f) In the first preferred embodiment, it is possible to easily provide an electronic device 301 in which a bonding failure, a positional shift of a mounting position, or the like, due to the positional shift of the mounting electrodes P1 and P2, is significantly reduced or prevented when the multilayer substrate is mounted on the mounting substrate.

(g) In the first preferred embodiment, the mounting electrodes P1 and P2 provided on the first main surface VS1 and the bonding electrodes 61 and 62 provided on the mounting surface S1 of the mounting substrate 201 are connected to each other through the insulating anisotropic conductive film 1. According to the above-described features, a portion of the insulating anisotropic conductive film 1 interposed between the mounting electrode (P1, P2) and the bonding electrode (61, 62) is electrically conducted by the pressure applied when the mounting substrate 201, the insulating anisotropic conductive film 1, and the multilayer substrate 101 are stacked and pressurized, so that the mounting electrode and the bonding electrode are easily electrically connected to each other.

(h) In a case in which the mounting electrode and the bonding electrode are connected through a conductive bonding material (solder, for example), the conductive bonding material is wetly spread, so that the mounting electrode and the first auxiliary pattern adjacent to or in a vicinity of the mounting electrode are short-circuited (electrically connected), and a change in characteristics may occur. On the other hand, in the first preferred embodiment, only the portion of the insulating anisotropic conductive film 1 interposed between the mounting electrode (a portion projecting from the first main surface VS1) and the bonding electrode (a portion projecting from the mounting surface S1) is electrically conducted, so that the insulation between the mounting electrode and the first auxiliary pattern that are adjacent to or in a vicinity of each other is easy.

It is to be noted that, while the first preferred embodiment provides an example in which the multilayer substrate 101 and the mounting substrate 201 are connected to each other, while interposing the insulating anisotropic conductive film 1 between the multilayer substrate 101 and the mounting substrate 201, the present invention is not limited to such a structural arrangement. The multilayer substrate 101 may be connected to the mounting substrate 201 through the conductive bonding material (solder, for example).

In addition, a protective layer, for example, a cover lay film or a solder resist film may be provided on the first main surface VS1 or the second main surface VS2 of the stacked body 10. However, in a case in which a protective film is provided on the first main surface VS1 of the stacked body 10, in a plan view of the first main surface VS1 (when viewed in the Z-axis direction), the protective film preferably does not overlap with the first auxiliary patterns 41A and 41B. In a case in which the protective film overlaps with the first auxiliary pattern, a portion in which the first auxiliary patterns 41A and 42B and the protective film are provided may become a convex portion protruding farther than the mounting electrodes P1 and P2, and connection between the multilayer substrate 101 using the insulating anisotropic conductive film 1 and the mounting substrate 201 becomes difficult.

The electronic device 301 (the structure in which the multilayer substrate 101 is mounted) according to the first preferred embodiment is manufactured by, for example, the following manufacturing method.

(1) First, a mounting substrate 201 including a mounting surface S1 on which bonding electrodes 61 and 62 are provided is prepared. A portion on which the bonding electrodes 61 and 62 are provided is a convex portion protruding farther than other portions of the mounting surface S1.

(2) Subsequently, an insulating anisotropic conductive film 1 is stacked on the mounting surface S1 (at least on the bonding electrodes 61 and 62) of the mounting substrate 201.

A step of placing the insulating anisotropic conductive film 1 on a surface of the bonding electrode 61, 62 being a convex portion protruding farther than at least other portions of the mounting surface S1 is an example of the "anisotropic element placing step".

(3) Subsequently, a multilayer substrate 101 is prepared. Then, the multilayer substrate 101 is stacked on the mounting surface S1 of the mounting substrate 201 so that the mounting electrode (P1, P2) may face the bonding electrode (61, 62) while interposing the insulating anisotropic conductive film 1 between the multilayer substrate 101 and the mounting substrate 201.

A step of stacking the multilayer substrate 101 on the mounting surface S1 of the mounting substrate 201 so that the mounting electrodes may face the bonding electrodes while interposing the insulating anisotropic conductive film 1 between the multilayer substrate 101 and the mounting substrate 201 after the "anisotropic element placing step" is an example of the "multilayer substrate placing step".

(4) Subsequently, the multilayer substrate 101 and the mounting substrate 201 are heated and pressed in a stacking direction (the Z-axis direction in FIG. 3) in which the multilayer substrate 101 and the mounting substrate 201 are stacked on each other. As a result, only the portion of the insulating anisotropic conductive film 1 interposed between the mounting electrode (a portion projecting from the first main surface VS1) and the bonding electrode (a portion projecting from the mounting surface S1) is electrically conducted.

Accordingly, a step of heating and pressing the multilayer substrate 101 and the mounting substrate 201 in the stacking direction and causing the mounting electrode and the bonding electrode to be electrically connected to each other after the "multilayer substrate placing step" is an example of the "heating and pressing step".

Second Preferred Embodiment

A second preferred embodiment of the present invention provides an example in which the shape and number of first auxiliary patterns are different.

Figure 4A:
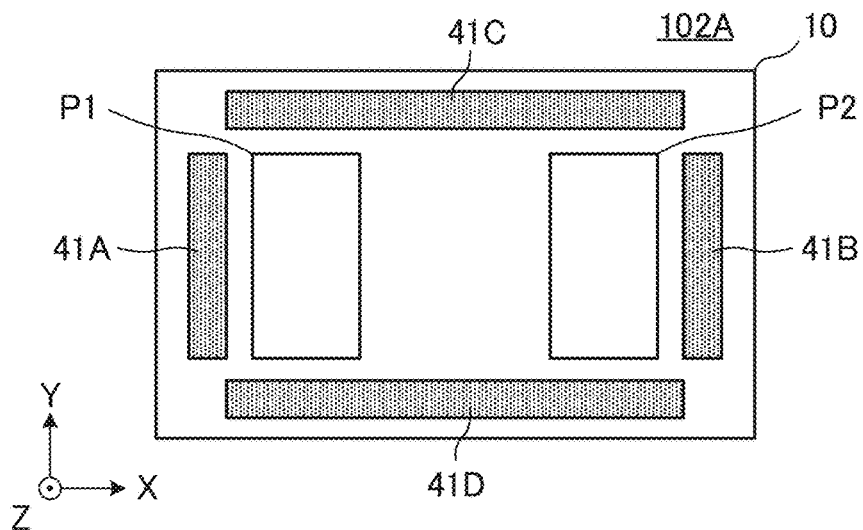
FIG. 4A is a plan view of a multilayer substrate 102A according to a second preferred embodiment of the present invention.
Figure 4B:
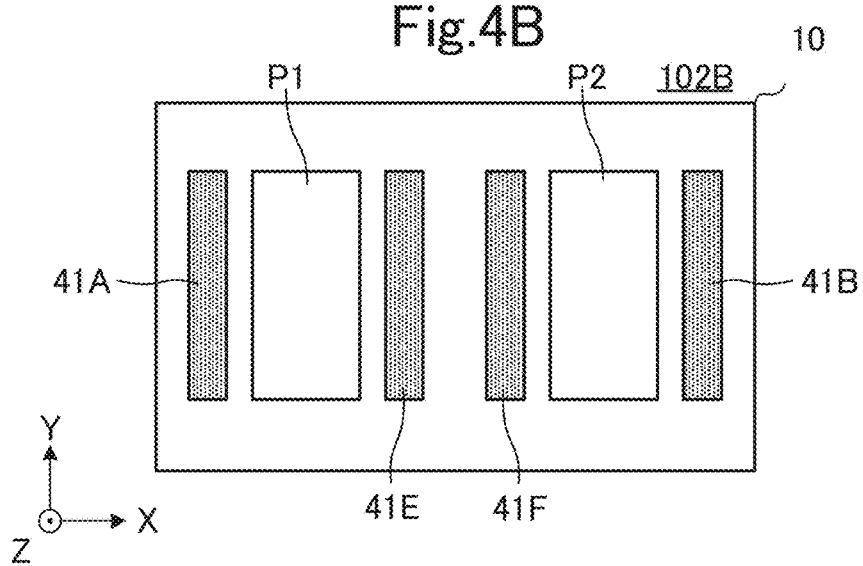
FIG. 4B is a plan view of a multilayer substrate 102B according to the second preferred embodiment of the present invention.
Figure 4C:
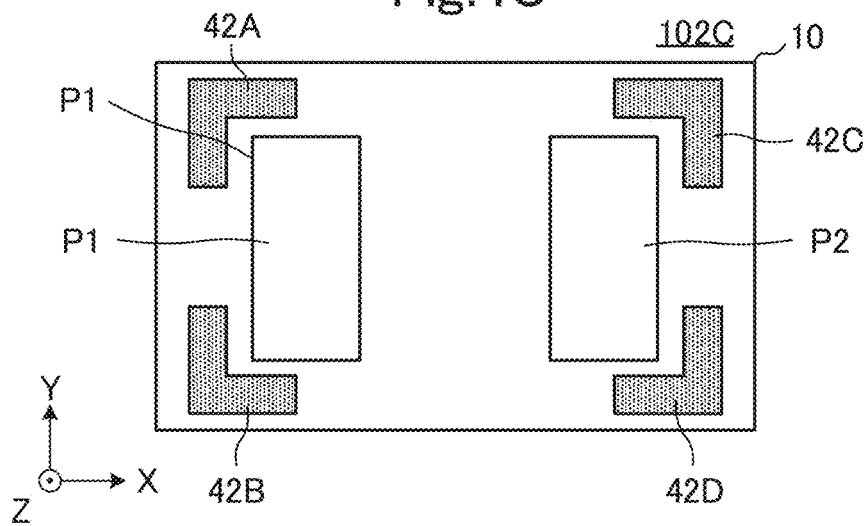
FIG. 4C is a plan view of a multilayer substrate 102C according to the second preferred embodiment of the present invention.

FIG. 4A is a plan view of a multilayer substrate 102A according to the second preferred embodiment of the present invention, FIG. 4B is a plan view of a multilayer substrate 102B according to the second preferred embodiment of the present invention, and FIG. 4C is a plan view of a multilayer substrate 102C according to the second preferred embodiment of the present invention. In FIGS. 4A to 4C, first auxiliary patterns 41A, 41B, 41C, 41D, 41E, 41F, 42A, 42B, 42C, and 42D are indicated by a dot pattern.

The multilayer substrate 102A is different from the multilayer substrate 101 according to the first preferred embodiment in that the multilayer substrate 102A further includes first auxiliary patterns 41C and 41D. Hereinafter, the differences from the multilayer substrate 101 according to the first preferred embodiment will be described.

The first auxiliary patterns 41C and 41D are provided on the first main surface of the stacked body 10 and located adjacent to or in a vicinity of the mounting electrodes P1 and P2. The first auxiliary patterns 41C and 41D are linear or substantially linear conductor patterns extending in the X-axis direction. The first auxiliary pattern 41C is located adjacent to or in a vicinity of a third side (the upper side of the stacked body 10 in FIG. 4A) of the stacked body 10, and the first auxiliary pattern 41D is located adjacent to or in a vicinity of a fourth side (the lower side of the stacked body 10 in FIG. 4A) of the stacked body 10.

It is to be noted that a portion (the lower side of the first auxiliary pattern 41C in FIG. 4A) of the first auxiliary pattern 41C that faces the mounting electrodes P1 and P2 has a shape along the outer shape of the mounting electrodes P1 and P2. Similarly, a portion (the upper side of the first auxiliary pattern 41D in FIG. 4A) of the first auxiliary pattern 41D that faces the mounting electrodes P1 and P2 has a shape along the outer shape of the mounting electrodes P1 and P2. In addition, the mounting electrodes P1 and P2 includes a portion interposed only between the first auxiliary patterns 41C and 41D in the Y-axis direction, when viewed in the Z-axis direction.

According to the multilayer substrate 102A of the second preferred embodiment of the present invention, the following advantageous effects in addition to the advantageous effects described in the first preferred embodiment are obtained.

(i) In the multilayer substrate 102A, the mounting electrode P1 is interposed between the first auxiliary pattern 41A and a different conductor pattern (the mounting electrode P2) in the X-axis direction, and is also interposed between the first auxiliary patterns 41C and 41D in the Y-axis direction. In addition, the mounting electrode P2 is interposed between the first auxiliary pattern 41B and a different conductor pattern (the mounting electrode P1) in the X-axis direction, and is also interposed between the first auxiliary patterns 41C and 41D in the Y-axis direction. Therefore, the positional shift of the mounting electrodes P1 and P2 at the time of heating and pressing is able to be further significantly reduced or prevented.

(j) In addition, as shown in the multilayer substrate 102A, the mounting electrode preferably includes, for example, a portion interposed only between the first auxiliary patterns. The structure of the mounting electrode being interposed between the first auxiliary patterns adjacent to or in a vicinity of the mounting electrode, compared to the mounting electrode being interposed between the first auxiliary pattern and a different conductor pattern, is able to significantly reduce or prevent a flow of the insulating base material layers adjacent to or in a vicinity of the mounting electrode at the time of heating and pressing. Therefore, the positional shift of the mounting electrode at the time of heating and pressing is able to be significantly reduced or prevented.

Subsequently, a multilayer substrate 102B will be described. The multilayer substrate 102B is different from the multilayer substrate 101 according to the first preferred embodiment in that the multilayer substrate 102B further includes first auxiliary patterns 41E and 41F. Hereinafter, the differences from the multilayer substrate 101 according to the first preferred embodiment will be described.

The first auxiliary patterns 41E and 41F are provided on the first main surface of the stacked body 10 and located adjacent to or in a vicinity of the mounting electrode P1. The first auxiliary patterns 41E and 41F are linear conductor patterns extending in the Y-axis direction. The first auxiliary pattern 41E is located on an opposite side (the positive X direction of the mounting electrode P1) of the first auxiliary pattern 41A while interposing the mounting electrode P1 between the first auxiliary pattern 41E and the first auxiliary pattern 41A. The first auxiliary pattern 41F is located on an opposite side (the negative X direction of the mounting electrode P2) of the first auxiliary pattern 41B while interposing the mounting electrode P2 between the first auxiliary pattern 41F and the first auxiliary pattern 41B.

A portion (a left side of the first auxiliary pattern 41E in FIG. 4B) of the first auxiliary pattern 41E that faces the mounting electrode P1 has a shape along the outer shape of the mounting electrode P1. A portion (a right side of the first auxiliary pattern 41F in FIG. 4B) of the first auxiliary pattern 41F that faces the mounting electrode P2 has a shape along the outer shape of the mounting electrode P2.

The mounting electrode P1 includes a portion interposed only between the first auxiliary patterns 41A and 41E in the X-axis direction, when viewed in the Z-axis direction. In addition, the mounting electrode P2 includes a portion interposed only between the first auxiliary patterns 41B and 41F in the Y-axis direction, when viewed in the Z-axis direction.

Even with the above-described features, advantageous functions and effects similar to the advantageous functions and effects of the multilayer substrate 102A are able to be obtained.

Subsequently, a multilayer substrate 102C will be described. The multilayer substrate 102C is different from the multilayer substrate 101 according to the first preferred embodiment in that the multilayer substrate 102C includes first auxiliary patterns 42A, 42B, 42C, and 42D instead of the first auxiliary patterns 41A and 41B. Hereinafter, the differences from the multilayer substrate 101 according to the first preferred embodiment will be described.

The first auxiliary patterns 42A and 42B are conductor patterns that are located adjacent to or in a vicinity of the mounting electrode P1 and bent in an L shape. The first auxiliary pattern 42A is located adjacent to or in a vicinity of a first corner portion (an upper left corner of the stacked body 10 in FIG. 4C) of the stacked body 10, and the first auxiliary pattern 42B is located adjacent to or in a vicinity of a second corner portion (a lower left corner of the stacked body 10 in FIG. 4C) of the stacked body 10.

The first auxiliary patterns 42C and 42D are conductor patterns that are located adjacent to or in a vicinity of the mounting electrode P2 and bent in an L shape. The first auxiliary pattern 42C is located adjacent to or in a vicinity of a third corner portion (an upper right corner of the stacked body 10 in FIG. 4C) of the stacked body 10, and the first auxiliary pattern 42C is located adjacent to or in a vicinity of a fourth corner portion (a lower right corner of the stacked body 10 in FIG. 4C) of the stacked body 10.

The mounting electrode P1, when viewed in the Z-axis direction, is interposed between the first auxiliary patterns 42A and 42B and a different conductor pattern (the mounting electrode P2) in the X-axis direction. In addition, the mounting electrode P1 includes a portion interposed only between the first auxiliary patterns 42A and 42B in the Y-axis direction. The mounting electrode P2, when viewed in the Z-axis direction, is interposed between the first auxiliary patterns 42C and 42D and a different conductor pattern (the mounting electrode P1) in the X-axis direction. In addition, the mounting electrode P2 includes a portion interposed only between the first auxiliary patterns 42C and 42D in the Y-axis direction.

According to the multilayer substrate 102C of the second preferred embodiment of the present invention, the following advantageous effects in addition to the above-described advantageous effects are obtained.

(k) The multilayer substrate 102C includes first auxiliary patterns 42A, 42B, 42C, and 42D being conductor patterns bent in an L shape. Accordingly, since the first auxiliary pattern includes a bent portion (a position extending in a plurality of directions), the occurrence of a positional shift of the first auxiliary pattern itself in the plurality of directions at the time of heating and pressing is able to be significantly reduced or prevented.

It is to be noted that a plurality of first auxiliary patterns may surround a mounting electrode. For example, by placing the first auxiliary patterns (the first auxiliary patterns 41E and 41F, for example) between the mounting electrodes P1 and P2, a plurality of first auxiliary patterns may surround the mounting electrodes P1 and P2. In addition, for example, by respectively placing a plurality of first auxiliary patterns at each corner portion of the rectangular mounting electrodes P1 and P2 (the first auxiliary pattern is located at each of the upper right corner portion and the lower right corner portion of the mounting electrode P1 shown in FIG. 4C, and the first auxiliary pattern is located at each of the upper left corner portion and the lower left corner portion of the mounting electrode P2, for example), a plurality of first auxiliary patterns may surround the mounting electrodes P1 and P2.

In addition, while the multilayer substrate 102C provides an example in which the first auxiliary patterns 42A, 42B, 42C, and 42D that are bent in an L shape are provided, the shape of a bent first auxiliary pattern is not limited to an L shape. For example, the shape of the bent first auxiliary pattern may be a C shape, a T shape, a Y shape, a crank shape, or any suitable shape.

Third Preferred Embodiment

A third preferred embodiment of the present invention provides an example in which the shape of the mounting electrode and the first auxiliary pattern is different.

Figure 5A:
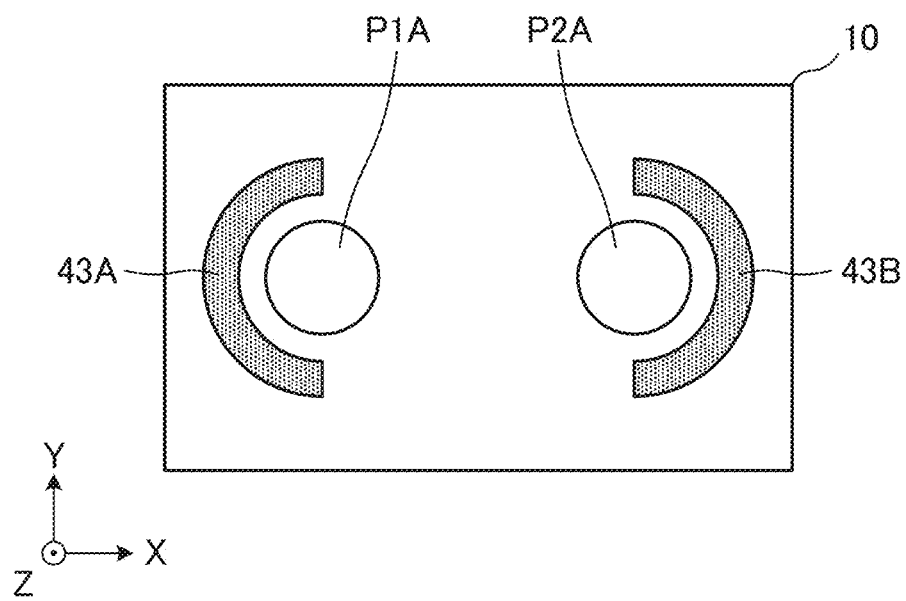
FIG. 5A is a plan view of a multilayer substrate 103A according to a third preferred embodiment of the present invention.
Figure 5B:
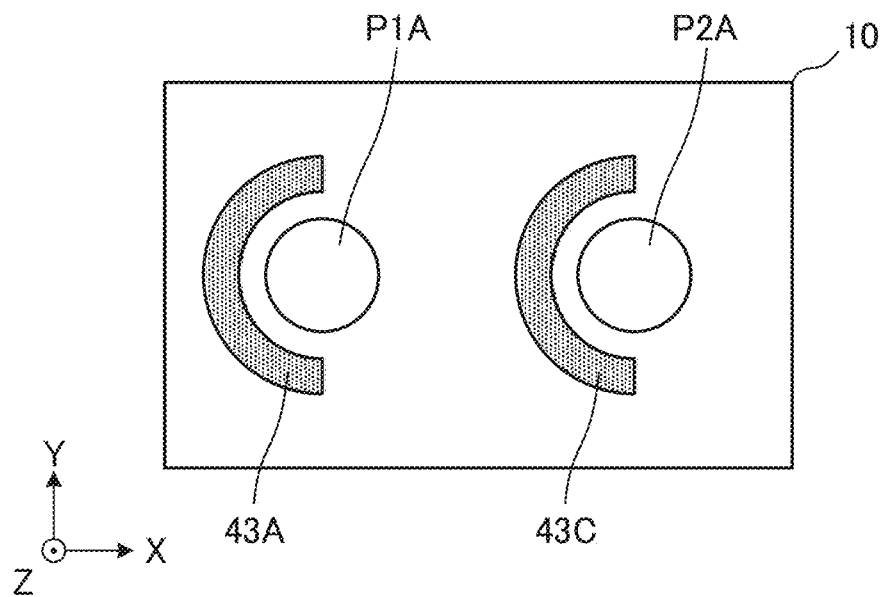
FIG. 5B is a plan view of a multilayer substrate 103B according to the third preferred embodiment of the present invention.

FIG. 5A is a plan view of a multilayer substrate 103A according to the third preferred embodiment of the present invention, and FIG. 5B is a plan view of a multilayer substrate 103B according to the third preferred embodiment. In FIGS. 5A and 5B, first auxiliary patterns 43A, 43B, and 43C are indicated by a dot pattern.

The multilayer substrate 103A is different from the multilayer substrate 101 according to the first preferred embodiment in that the multilayer substrate 103A includes mounting electrodes P1A and P2A and first auxiliary patterns 43A and 43B. Hereinafter, the differences from the multilayer substrate 101 according to the first preferred embodiment will be described.

The mounting electrodes P1A and P2A are circular conductor patterns provided on the first main surface of the stacked body 10. The first auxiliary patterns 43A and 43B are C-shaped (arc-shaped) conductor patterns provided on the first main surface of the stacked body 10. The mounting electrode P1A and the first auxiliary pattern 43A are located adjacent to or in a vicinity of a first side (a left side of the stacked body 10 in FIG. 5A) of the stacked body 10. The mounting electrode P2A and the first auxiliary pattern 43B are located adjacent to or in a vicinity of a second side (a right side of the stacked body 10 in FIG. 5A) of the stacked body 10.

It is to be noted that a portion (a right peripheral end of the first auxiliary pattern 43A in FIG. 5A) of the first auxiliary pattern 43A that faces the mounting electrode P1A has a shape along the outer shape of the mounting electrode P1A. Similarly, a portion (a left peripheral end of the first auxiliary pattern 43B in FIG. 5A) of the first auxiliary pattern 43B that faces the mounting electrode P2A has a shape along the outer shape of the mounting electrode P2A.

The mounting electrode P1A, when viewed in the Z-axis direction, is interposed between the first auxiliary pattern 43A and a different conductor pattern (the mounting electrode P2A) in the X-axis direction. In addition, the mounting electrode P1A includes a portion partially surrounded by only the first auxiliary pattern 43A in the Y-axis direction. The mounting electrode P2A, when viewed in the Z-axis direction, is interposed between the first auxiliary pattern 43B and a different conductor pattern (the mounting electrode P1A) in the X-axis direction. In addition, the mounting electrode P2A includes a portion partially surrounded by only the first auxiliary pattern 43B in the Y-axis direction.

Even with the above-described structure, the basic features of the multilayer substrate 103A are the same as or similar to the features of the multilayer substrate 102A according to the second preferred embodiment, and the advantageous functions and effects of the multilayer substrate 103A are the same as or similar to the advantageous functions and effects of the multilayer substrate 102A. It is to be noted that, in the multilayer substrate 103A, when viewed in the Z-axis direction, a mounting electrode provided region (the mounting electrodes P1A and P2A, and a portion interposed between the mounting electrode P1A and the mounting electrode P2A) including the mounting electrodes P1A and P2A is interposed between the first auxiliary patterns 43A and 43B. With such a structure, a flow of the insulating base material layers of the entire mounting electrode provided region at the time of heating and pressing is able to be significantly reduced or prevented.

Subsequently, a multilayer substrate 103B will be described. The multilayer substrate 103B is different from the above-described multilayer substrate 103A in that the multilayer substrate 103B includes the first auxiliary pattern 43C instead of the first auxiliary pattern 43B. Hereinafter, the differences from the multilayer substrate 103A will be described.

The first auxiliary pattern 43C is an arc-shaped conductor pattern provided on the first main surface of the stacked body 10. The first auxiliary pattern 43C is located adjacent to or in a vicinity of the second side (the right side of the stacked body 10 in FIG. 5B) of the stacked body 10. A portion (the right peripheral end of the first auxiliary pattern 43C in FIG. 5B) of the first auxiliary pattern 43C that faces the mounting electrode P2A has a shape along the outer shape of the mounting electrode P2A.

The mounting electrode P1A, when viewed in the Z-axis direction, includes a portion interposed only between the first auxiliary patterns 43A and 43C in the X-axis direction, and includes a portion partially surrounded by only the first auxiliary pattern 43A in the Y-axis direction. The mounting electrode P2A, when viewed in the Z-axis direction, includes a portion partially surrounded by only the first auxiliary pattern 43C in the Y-axis direction.

Fourth Preferred Embodiment

A fourth preferred embodiment of the present invention provides an example in which a single first auxiliary pattern is provided.

Figure 6A:
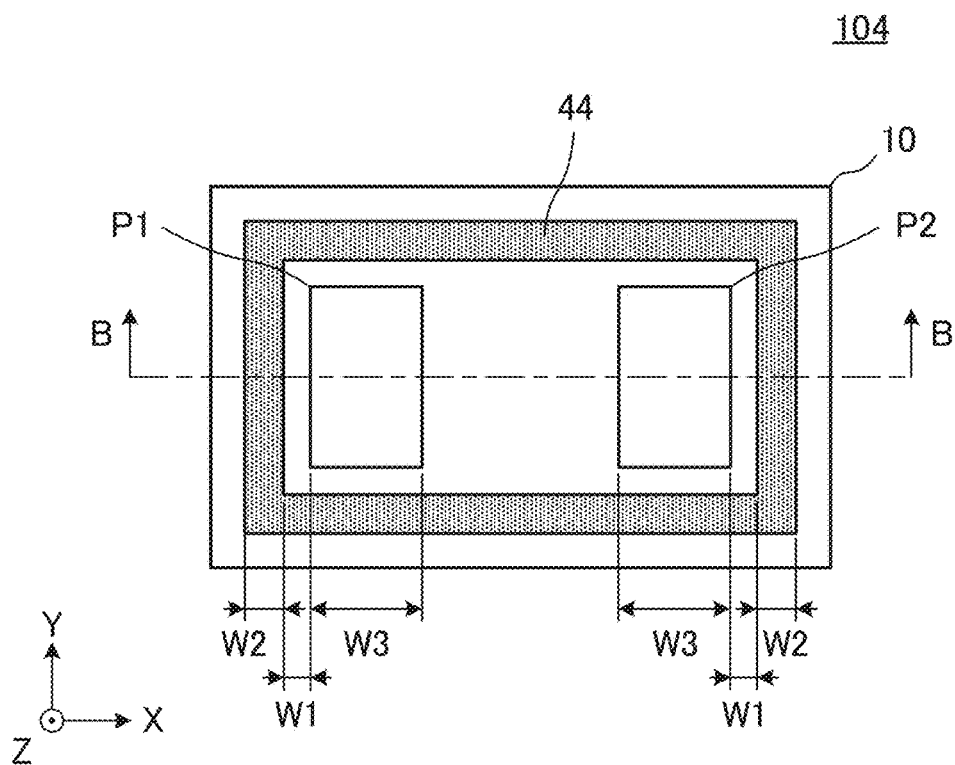
FIG. 6A is a plan view of a multilayer substrate 104 according to a fourth preferred embodiment of the present invention.
Figure 6B:
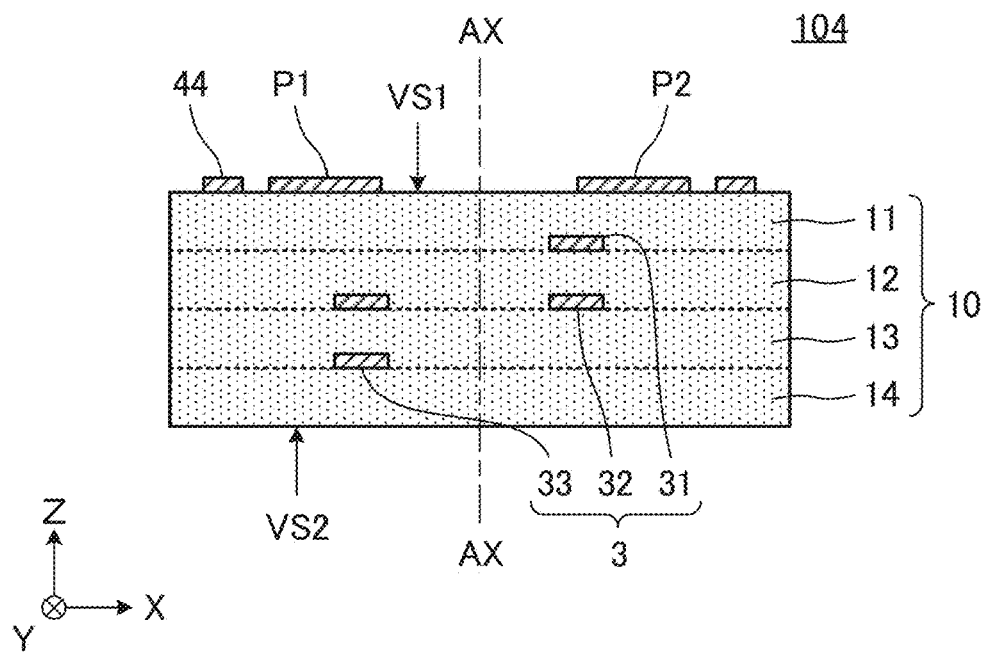
FIG. 6B is a B-B cross-sectional view in FIG. 6A.
Figure 7:
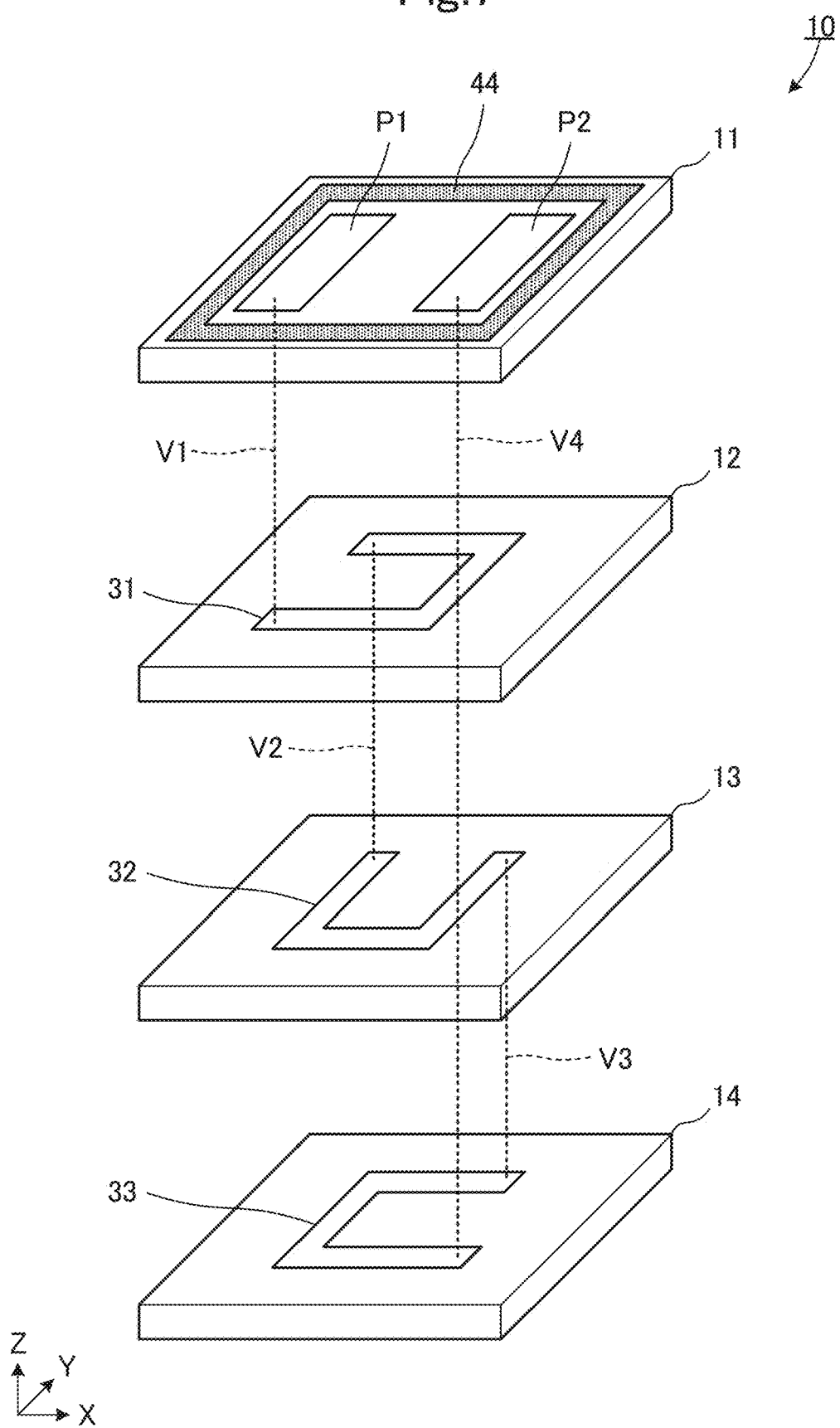
FIG. 7 is an exploded perspective view of a stacked body 10 included in the multilayer substrate 104.

FIG. 6A is a plan view of a multilayer substrate 104 according to the fourth preferred embodiment of the present invention, and FIG. 6B is a B-B cross-sectional view in FIG. 6A. FIG. 7 is an exploded perspective view of a stacked body 10 included in the multilayer substrate 104. In FIG. 5A and FIG. 7, in order to make the structure easy to understand, a first auxiliary pattern 44 is indicated by a dot pattern.

The multilayer substrate 104 is different from the multilayer substrate 101 according to the first preferred embodiment in that the multilayer substrate 104 includes a first auxiliary pattern 44 instead of the first auxiliary patterns 41A and 41B. Hereinafter, the differences from the multilayer substrate 101 according to the first preferred embodiment will be described.

The first auxiliary pattern 44 is a ring-shaped conductor pattern provided along the outer periphery of the first main surface of the stacked body 10 and surrounding the mounting electrodes P1 and P2. The first auxiliary pattern 44 is located adjacent to or in a vicinity of the mounting electrodes P1 and P2. Specifically, a portion (an inner peripheral end on the left side of the first auxiliary pattern 44 in FIG. 6A) of the first auxiliary pattern that faces the mounting electrode P1 has a shape along the outer shape of the mounting electrode P1. Similarly, a portion (an inner peripheral end on the right side of the first auxiliary pattern 44 in FIG. 6A) of the first auxiliary pattern 44 that faces the mounting electrode P2 has a shape along the outer shape of the mounting electrode P2.

As shown in FIG. 6A, when viewed in the Z-axis direction, the three directions (the negative X direction, the positive Y direction, and the negative Y direction) of the four directions (the positive X direction, the negative X direction, the positive Y direction, and the negative Y direction) of the mounting electrode P1 are surrounded by the first auxiliary pattern 44, the four directions being perpendicular or substantially perpendicular to a radial direction from the mounting electrode P1. In addition, when viewed in the Z-axis direction, the three directions (the positive X direction, the positive Y direction, and the negative Y direction) of the four directions of the mounting electrode P2 are surrounded by the first auxiliary pattern 44, the four directions being perpendicular or substantially perpendicular to a radial direction from the mounting electrode P2.

It is to be noted that the description of "the mounting electrode is surrounded by the first auxiliary pattern" according to the present invention means that one continuous first auxiliary pattern is provided along the outer shape of the mounting electrode. In other words, the description of the "three directions of the four directions of the mounting electrode are surrounded by the first auxiliary pattern, the four directions being perpendicular or substantially perpendicular to a radial direction from the mounting electrode" means that one continuous first auxiliary pattern is provided along the outer shape of the mounting electrode over the three directions of the mounting electrode.

According to the multilayer substrate 104 of the fourth preferred embodiment of the present invention, the following advantageous effects in addition to the above-described advantageous effects are obtained.

(1) The three out of the four directions of the mounting electrodes P1 and P2 according to the fourth preferred embodiment are surrounded by the first auxiliary pattern 44, the four directions being perpendicular or substantially perpendicular to a radial direction from the mounting electrodes P1 and P2. According to the above-described features, it is possible to further increase a significant reduction effect of the flow of the insulating base material layers adjacent to or in a vicinity of the mounting electrodes P1 and P2 by the first auxiliary pattern at the time of heating and pressing. Therefore, with this structure, the positional shift of the mounting electrodes P1 and P2 at the time of heating and pressing is able to be further significantly reduced or prevented. In the fourth preferred embodiment, the first auxiliary pattern 44 continuously surrounds the mounting electrodes P1 and P2, so that a flow of the insulating base material layers of the entire mounting surface (the first main surface, the mounting region), in particular, at the time of heating and pressing is significantly reduced or prevented.

Fifth Preferred Embodiment

A fifth preferred embodiment of the present invention provides an example in which all of the four directions of a mounting electrode perpendicular or substantially perpendicular to a radial direction from the mounting electrode are surrounded by a first auxiliary pattern.

Figure 8A:
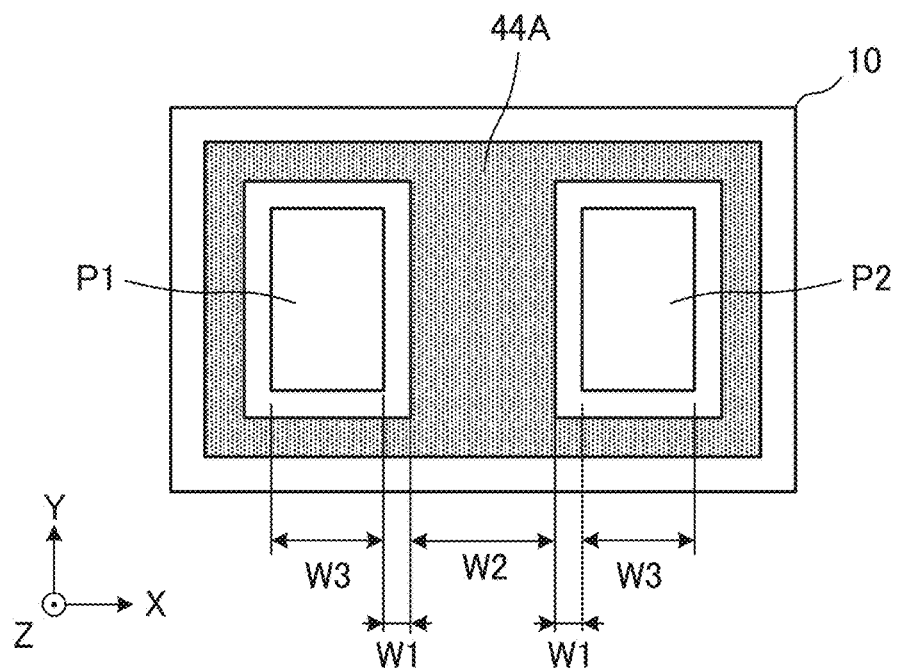
FIG. 8A is a plan view of a multilayer substrate 105A according to a fifth preferred embodiment of the present invention.
Figure 8B:
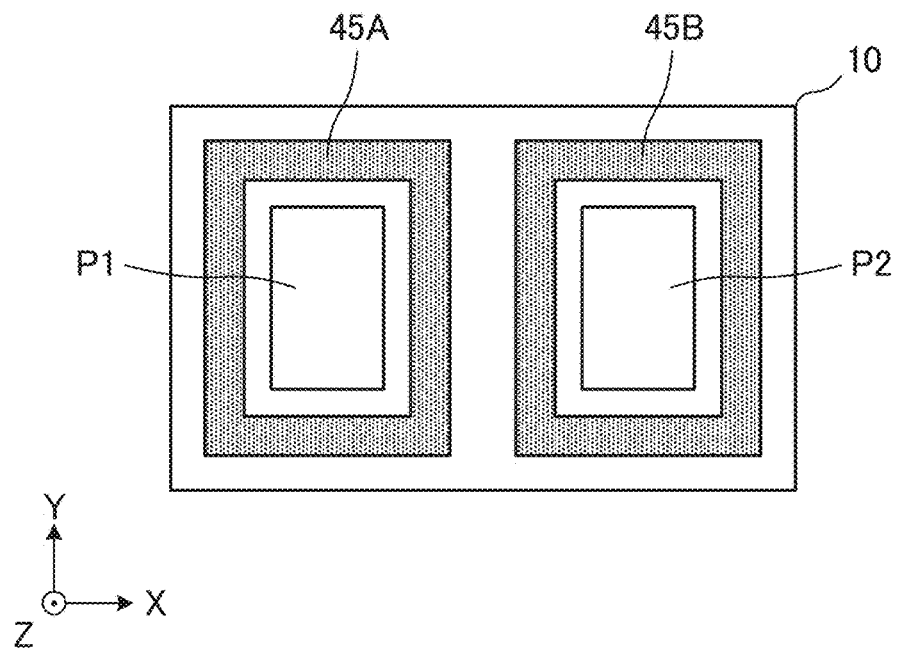
FIG. 8B is a plan view of a multilayer substrate 105B according to the fifth preferred embodiment of the present invention.

FIG. 8A is a plan view of a multilayer substrate 105A according to the fifth preferred embodiment of the present invention, and FIG. 8B is a plan view of a multilayer substrate 105B according to the fifth preferred embodiment. In FIGS. 8A and 8B, first auxiliary patterns 44A, 45A, and 45B are indicated by a dot pattern.

The multilayer substrate 105A is different from the multilayer substrate 104 according to the fourth preferred embodiment in that the multilayer substrate 105A includes a first auxiliary pattern 44A instead of the first auxiliary pattern 44. Hereinafter, the differences from the multilayer substrate 104 according to the fourth preferred embodiment will be described.

The first auxiliary pattern 44A is a planar conductor pattern provided on the substantially entire first main surface of the stacked body 10 and surrounding the mounting electrodes P1 and P2. The first auxiliary pattern 44A is located adjacent to or in a vicinity of the mounting electrodes P1 and P2. The first auxiliary pattern 44A includes a rectangular or substantially rectangular opening at a position corresponding to each of the mounting electrodes P1 and P2. The mounting electrodes P1 and P2 are located inside the opening of the first auxiliary pattern 44A.

As shown in FIG. 8A, when viewed in the Z-axis direction, all the four directions (the positive X direction, the negative X direction, the positive Y direction, and the negative Y direction) of the mounting electrode P1 are surrounded by the first auxiliary pattern 44A, the four directions being perpendicular or substantially perpendicular to a radial direction from the mounting electrode P1. In addition, when viewed in the Z-axis direction, all the four directions of the mounting electrode P2 are surrounded by the first auxiliary pattern 44A, the four directions being perpendicular or substantially perpendicular to a radial direction from the mounting electrode P2.

In addition, as shown in FIG. 8A, an area of the first auxiliary pattern 44A is larger than an area of each mounting electrode (the mounting electrode P1 or the mounting electrode P2). Further, a width (W2) of the first auxiliary pattern 44A in the first direction (the X-axis direction) that crosses the mounting electrode P1 and the first auxiliary pattern 44A is larger than a width (W3) of the mounting electrode P1 in the first direction (the X-axis direction). In addition, the width of the first auxiliary pattern 44A in the first direction is larger than the width of the mounting electrode P2 in the first direction.

According to the multilayer substrate 105A of the fifth preferred embodiment of the present invention, the following advantageous effects in addition to the advantageous effects described in the fourth preferred embodiment are obtained.

(m) All the four directions of the mounting electrodes P1 and P2 according to the fifth preferred embodiment are surrounded by the first auxiliary pattern 44A, the four directions being perpendicular or substantially perpendicular to a radial direction from the mounting electrodes P1 and P2. According to this structure, compared to a case in which the three out of the four directions of the mounting electrodes P1 and P2 are surrounded by the first auxiliary pattern (see the fourth preferred embodiment), a significant reduction effect of a flow of the insulating base material layers adjacent to or in a vicinity of the mounting electrodes P1 and P2 by the first auxiliary pattern at the time of heating and pressing is further increased.

(n) In addition, in the fifth preferred embodiment, the area of the first auxiliary pattern 44A is larger than the area of each mounting electrode. In general, a conductor pattern with a small area easily causes a positional shift due to a flow of the insulating base material layers at the time of heating and pressing. Therefore, according to this structure, the occurrence of a positional shift of the first auxiliary pattern itself at the time of heating and pressing is able to be significantly reduced or prevented.

(o) In the fifth preferred embodiment, the width (W2) of the first auxiliary pattern 44A in the first direction (the X-axis direction) is larger than the width (W3) of the mounting electrode P1 in the first direction (the X-axis direction). In addition, the width of the first auxiliary pattern 44A in the first direction is larger than the width of the mounting electrode P2 in the first direction. According to this structure, the occurrence of a positional shift of the first auxiliary pattern itself at the time of heating and pressing is able to be significantly reduced or prevented, so that the positional shift (the positional shift of the mounting electrodes P1 and P2 in the first direction, in particular) of the mounting electrodes P1 and P2 at the time of heating and pressing is significantly reduced or prevented.

Subsequently, a multilayer substrate 105B will be described. The multilayer substrate 105B is different from the multilayer substrate 104 according to the fourth preferred embodiment in that the multilayer substrate 105B includes first auxiliary patterns 45A and 45B instead of the first auxiliary pattern 44. Hereinafter, the differences from the multilayer substrate 104 according to the fourth preferred embodiment will be described.

The first auxiliary pattern 45A is a ring-shaped conductor pattern provided on the first main surface of the stacked body 10 and surrounding the mounting electrode P1. The first auxiliary pattern 45A is located adjacent to or in a vicinity of the mounting electrode P1. The first auxiliary pattern 45B is a ring-shaped conductor pattern provided on the first main surface of the stacked body 10 and surrounding the mounting electrode P2. The first auxiliary pattern 45B is located adjacent to or in a vicinity of the mounting electrode P2.

As shown in FIG. 8B, when viewed in the Z-axis direction, all the four directions (the positive X direction, the negative X direction, the positive Y direction, and the negative Y direction) of the mounting electrode P1 are surrounded by the first auxiliary pattern 45A, the four directions being perpendicular or substantially perpendicular to a radial direction from the mounting electrode P1. In addition, when viewed in the Z-axis direction, all the four directions of the mounting electrode P2 are surrounded by the first auxiliary pattern 45B, the four directions being perpendicular or substantially perpendicular to a radial direction from the mounting electrode P2. The first auxiliary pattern 45A that surrounds the mounting electrode P1 and the first auxiliary pattern 45B that surrounds the mounting electrode P2 are electrically independent from each other, so that, even when the mounting electrode P1 and the first auxiliary pattern 45A, or the mounting electrode P2 and the first auxiliary pattern 45B, are accidentally electrically connected to each other, short-circuiting hardly occurs.

Sixth Preferred Embodiment

A sixth preferred embodiment of the present invention provides an example of a multilayer substrate further including a second auxiliary pattern.

Figure 9A:
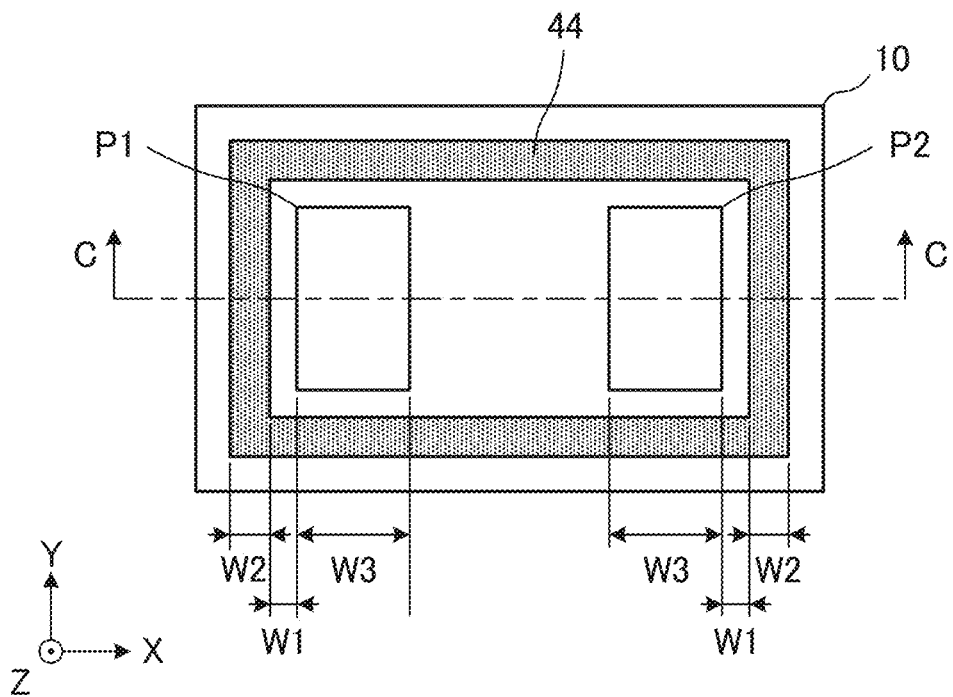
FIG. 9A is a plan view of a multilayer substrate 106 according to a sixth preferred embodiment of the present invention.
Figure 9B:
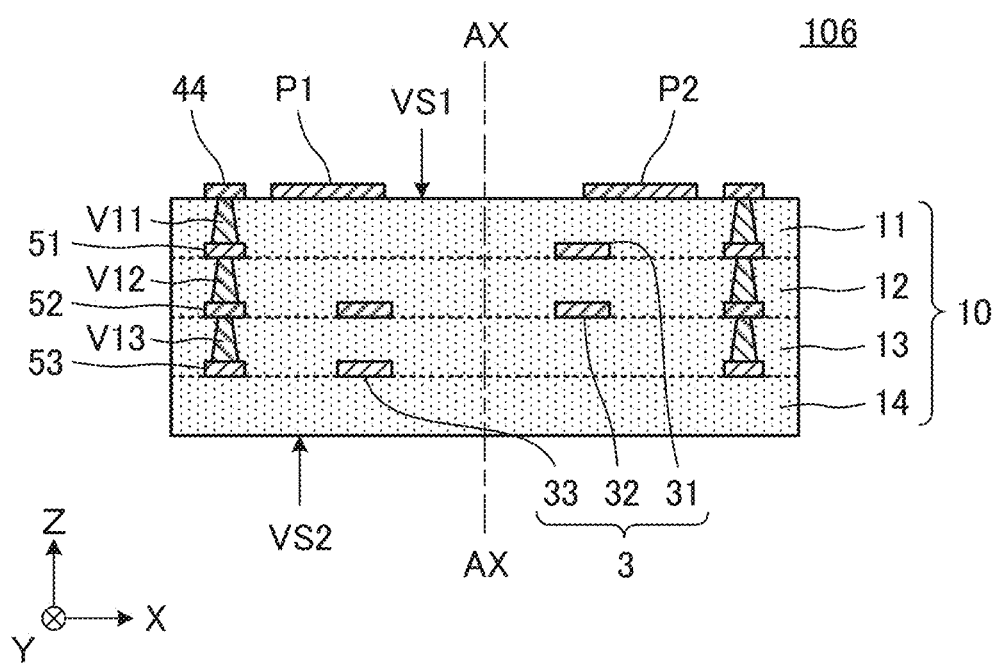
FIG. 9B is a C-C cross-sectional view in FIG. 9A.
Figure 10:
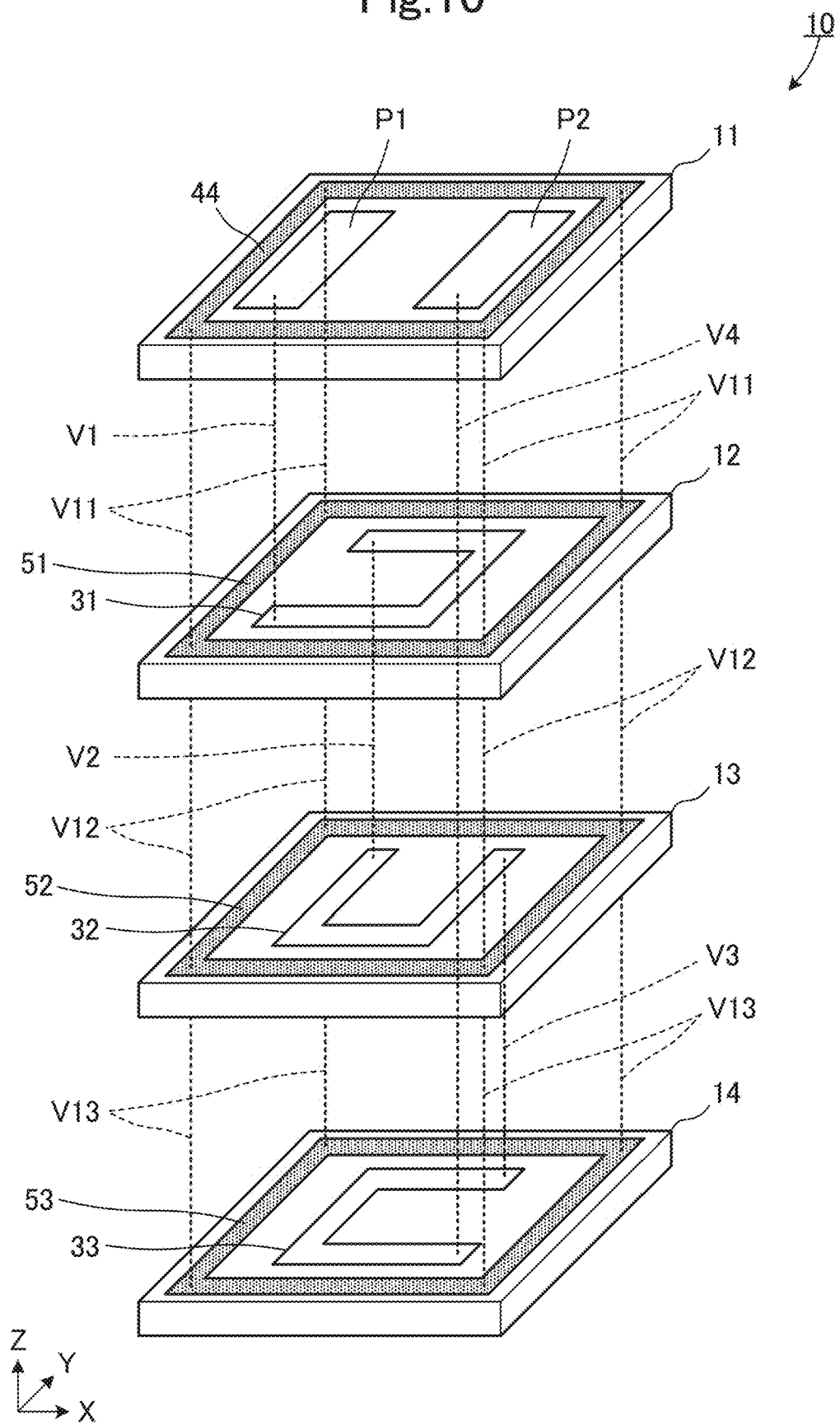
FIG. 10 is an exploded perspective view of a stacked body 10 included in the multilayer substrate 106.

FIG. 9A is a plan view of a multilayer substrate 106 according to the sixth preferred embodiment of the present invention, and FIG. 9B is a C-C cross-sectional view in FIG. 9A. FIG. 10 is an exploded perspective view of a stacked body 10 included in the multilayer substrate 106. In FIG. 9A and FIG. 10, in order to make the structure easy to understand, a first auxiliary pattern 44 and second auxiliary patterns 51, 52, and 53 are indicated by a dot pattern.

The multilayer substrate 106 is different from the multilayer substrate 104 according to the fourth preferred embodiment in that the multilayer substrate 106 further includes second auxiliary patterns 51, 52, and 53, and interlayer connection conductors V11, V12, and V13. Hereinafter, the differences from the multilayer substrate 104 according to the fourth preferred embodiment will be described.

The second auxiliary patterns 51, 52, and 53 are conductor patterns provided inside the stacked body 10. The interlayer connection conductors V11, V12, and V13 are conductors provided inside the stacked body 10. The second auxiliary patterns 51, 52, and 53 are preferably conductor patterns such as Cu foil, for example. It is to be noted that the second auxiliary patterns 51, 52, and 53 as well as the first auxiliary pattern 44 are not electrically connected to the mounting electrodes P1 and P2.

As shown in FIG. 10, the stacked body 10 includes a plurality of insulating base material layers 14, 13, 12, and 11 made of a resin as a main material and stacked in this order.

The mounting electrodes P1 and P2 and the first auxiliary pattern 44 are provided on a surface of the insulating base material layer 11. The mounting electrodes P1 and P2 are the same or substantially the same as the mounting electrodes described in the first preferred embodiment, and the first auxiliary pattern 44 is the same or substantially the same as the first auxiliary pattern described in the fourth preferred embodiment.

The coil conductor 31 and the second auxiliary pattern 51 are provided on a surface of the insulating base material layer 12. The second auxiliary pattern 51 is a ring-shaped conductor pattern provided along the outer periphery of the insulating base material layer 12 and surrounding the coil conductor 31. The coil conductor 31 is the same or substantially the same as the coil conductor described in the first preferred embodiment.

The coil conductor 32 and the second auxiliary pattern 52 are provided on a surface of the insulating base material layer 13. The second auxiliary pattern 52 is a ring-shaped conductor pattern provided along the outer periphery of the insulating base material layer 13 and surrounding the coil conductor 32. The coil conductor 32 is the same or substantially the same as the coil conductor described in the first preferred embodiment.

The coil conductor 33 and the second auxiliary pattern 53 are provided on a surface of the insulating base material layer 14. The second auxiliary pattern 53 is a ring-shaped conductor pattern provided along the outer periphery of the insulating base material layer 14 and surrounding the coil conductor 33. The coil conductor 33 is the same or substantially the same as the coil conductor described in the first preferred embodiment.

The first auxiliary pattern 44 is connected to the second auxiliary patterns 51, 52, and 53 through the interlayer connection conductors V11, V12, and V13. Specifically, as shown in FIG. 10, the first auxiliary pattern 44 is connected to the second auxiliary pattern 51 through the interlayer connection conductor V11 provided in the insulating base material layer 11. In addition, the second auxiliary pattern 51 is connected to the second auxiliary pattern 52 through the interlayer connection conductor V12 provided in the insulating base material layer 12. In addition, the second auxiliary pattern 52 is connected to the second auxiliary pattern 53 through the interlayer connection conductor V13 provided in the insulating base material layer 13.

In addition, as mainly shown in FIG. 9B and FIG. 10, the second auxiliary patterns 51, 52, and 53, when viewed in the Z-axis direction, surround an inner layer pattern (the coil conductors 31, 32, and 33).

According to the multilayer substrate 106 of the sixth preferred embodiment of the present invention, the following advantageous effects in addition to the advantageous effects described in the fourth preferred embodiment are obtained.

(p) In the sixth preferred embodiment, when viewed in the Z-axis direction, the second auxiliary patterns 51, 52, and 53 surround an inner layer pattern (the coil conductors 31, 32, and 33) are provided inside the stacked body 10. According to this structure, an excessive flow of the insulating base material layers inside the stacked body at the time of heating and pressing is able to be significantly reduced or prevented by the second auxiliary pattern. Therefore, the positional shift of the inner layer pattern at the time of heating and pressing is significantly reduced or prevented, and the change in stray capacitance or the change in characteristics due to the positional shift of the inner layer pattern is able to be significantly reduced or prevented.

(q) In addition, in the sixth preferred embodiment, the second auxiliary patterns 51, 52, and 53 respectively provided in the plurality of insulating base material layers 12, 13, and 14 are connected by the interlayer connection conductors V12 and V13. According to this structure, a positional shift of the second auxiliary patterns 51, 52, and 53 themselves at the time of heating and pressing is able to be significantly reduced or prevented, so that the positional shift of the inner layer pattern at the time of heating and pressing is further significantly reduced or prevented.

(r) Further, in the sixth preferred embodiment, the first auxiliary pattern 44 and the second auxiliary patterns 51, 52, and 53 are connected by the interlayer connection conductors V11, V12, and V13. According to this structure, compared to a case in which the first auxiliary pattern and the second auxiliary pattern are not connected by the interlayer connection conductor, the positional shift of the first auxiliary pattern 44 and the second auxiliary patterns 51, 52, and 53 at the time of heating and pressing is able to be further significantly reduced or prevented. Therefore, the positional shift of the mounting electrodes P1 and P2 and the inner layer pattern at the time of heating and pressing is able to be further significantly reduced or prevented. It is to be noted that, in terms of significantly reducing or preventing the positional shift of the mounting electrodes P1 and P2 and the inner layer pattern at the time of heating and pressing, as shown in the sixth preferred embodiment, the structure in which the first auxiliary pattern 44 surrounds the mounting electrodes P1 and P2 are connected to the second auxiliary patterns 51, 52, and 53 surrounding the inner layer pattern is preferable, for example.

In addition, while the sixth preferred embodiment of the present invention provides an example in which the second auxiliary pattern is a ring-shaped conductor pattern surrounding the inner layer pattern, the shape of the second auxiliary pattern is not limited to this structure. The shape of the second auxiliary pattern is able to be appropriately changed within the scope of advantageous functions and effects of the preferred embodiments of the present invention, and may be a linear or substantially linear shape, a C shape, a Y shape, a T shape, a circle, an ellipse shape, a polygon, or the like, for example. However, in terms of significantly reducing or preventing the positional shift of the inner layer pattern at the time of heating and pressing, the second auxiliary pattern is preferably, for example, a ring-shaped conductor pattern surrounding the inner layer pattern.

Other Preferred Embodiments

While each of the above described preferred embodiments of the present invention provides an example in which the stacked body 10 has a rectangular parallelepiped shape or a substantially a rectangular parallelepiped shape, the present invention is not limited to this structure. The shape of the stacked body 10 is able to be appropriately changed within the scope of advantageous functions and effects of the preferred embodiments of the present invention. The planar shape of the stacked body 10 may be a polygon, a circle, an ellipse, a crank shape, a T shape, a Y shape, or the like, for example.

In addition, while each of the above described preferred embodiments of the present invention provides an example of the stacked body 10 provided by stacking four insulating base material layers 11, 12, 13, and 14 on one another, the present invention is not limited to this structure. The number of layers of the insulating base material layers to provide the stacked body 10 is able to be appropriately changed within the scope of advantageous functions and effects of the preferred embodiments of the present invention.

While each of the above described preferred embodiments of the present invention provides an example in which the plurality of insulating base material layers to provide the stacked body 10 include a thermoplastic resin, the present invention is not limited to this structure. The plurality of insulating base material layers may be a thermosetting resin. However, in a case in which the plurality of insulating base material layers include a thermoplastic resin, as described above, the stacked body is easily provided by collectively pressing, so that the number of steps of manufacturing a multilayer substrate is reduced, and the cost is able to be reduced to a low level.

In addition, the arrangement, the shape, the size, the number, and other parameters of the mounting electrode and the first auxiliary pattern are not limited to the example in each of the above described preferred embodiments, and are able to be appropriately changed within the scope of advantageous functions and effects of the present invention.

While each of the above described preferred embodiments of the present invention provides an example in which the coil 3 having a rectangular helical shape or a substantially rectangular helical shape of more than about two turns including the winding axis AX in the stacking direction (the Z-axis direction) of the plurality of insulating base material layers is provided, the shape, the number of turns, and other parameters of the coil are not limited to this structure. The outer shape, the specific structural features, and the number of turns of the coil are able to be appropriately changed within the scope of advantageous functions and effects of the preferred embodiments of the present invention. The outer shape (the outer shape of the coil viewed in the direction of the winding axis AX) of the coil may not be limited to a rectangle, and may be a circle, an ellipse, or the like, for example. In addition, the winding axis AX of the coil does not necessarily extend in the stacking direction (the Z-axis direction), and may extend in the X-axis direction or in the Y-axis direction, for example.

In addition, while each of the above described preferred embodiments provides an example in which the coil 3 is provided in contact with the stacked body 10, the circuit provided in contact with the stacked body 10 is not limited to this structure. The stacked body 10 may include a capacitor defined by a conductor pattern, various types of transmission lines (a strip line, a microstrip line, a coplanar line, for example), or various types of filters (a low pass filter, a high pass filter, a band pass filter, a band elimination filter, for example). In other words, the "inner layer pattern" according to the present invention is not limited only to the coil conductor. In addition, a conductor pattern other than the mounting electrode and the first auxiliary pattern may be provided on the surface of the stacked body 10.

Further, for example, a chip component such as a chip inductor or a chip capacitor may be mounted in contact with the stacked body 10. Further, the chip component may be embedded inside the stacked body 10.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer substrate comprising:
 a stacked body including a plurality of insulating base material layers made of a resin as a main material and stacked on one another, and including a main surface; and
 a conductor pattern including:
  an inner layer pattern provided inside the stacked body;
  a mounting electrode provided on the main surface and electrically connected to the inner layer pattern; and
  a first auxiliary pattern provided on the main surface and located adjacent to or in a vicinity of the mounting electrode; wherein
 the mounting electrode is electrically connected to a structure outside of the multilayer substrate and physically bonds the multilayer substrate to the structure;
 the mounting electrode, in a plan view of the main surface, is interposed between a first portion of the first auxiliary pattern, and a second portion of the first auxiliary pattern or a different conductor pattern;
 the first auxiliary pattern is electrically independent from the mounting electrode and the inner layer pattern; and
 a distance between the mounting electrode and the first auxiliary pattern in a first direction that crosses the mounting electrode and the first auxiliary pattern is smaller than a width of the first auxiliary pattern in the first direction.

2. The multilayer substrate according to claim 1, wherein the first auxiliary pattern includes a portion facing the mounting electrode; and
 the portion has a shape along an outer shape of the mounting electrode.

3. The multilayer substrate according to claim 1, wherein an area of the first auxiliary pattern is larger than an area of the mounting electrode.

4. The multilayer substrate according to claim 1, wherein the width of the first auxiliary pattern in the first direction is larger than a width of the mounting electrode in the first direction.

5. The multilayer substrate according to claim 1, wherein the mounting electrode, in the plan view of the main surface, includes a portion partially surrounded by only the first auxiliary pattern.

6. The multilayer substrate according to claim 1, wherein the conductor pattern further includes:
a second auxiliary pattern provided inside the stacked body and surrounding the inner layer pattern in the plan view of the main surface.

7. The multilayer substrate according to claim 6, further comprising:
an interlayer connection conductor provided inside the stacked body; wherein
the first auxiliary pattern and the second auxiliary pattern are connected to each other through the interlayer connection conductor.

8. The multilayer substrate according to claim 1, further comprising:
a protective layer provided on the main surface; wherein
the protective layer, in the plan view of the main surface, does not overlap with the first auxiliary pattern.

9. The multilayer substrate according to claim 1, wherein
the mounting electrode includes a plurality of mounting electrodes;
the first auxiliary pattern includes a plurality of first auxiliary patterns; and
the plurality of first auxiliary patterns are located adjacent to or in a vicinity of different mounting electrodes, respectively.

10. A multilayer substrate mounting structure comprising:
a multilayer substrate; and
a mounting substrate on which the multilayer substrate is mounted, the mounting substrate including a mounting surface and a bonding electrode on the mounting surface;
wherein
the multilayer substrate includes:
a stacked body including a plurality of insulating base material layers made of a resin as a main material and stacked on one another, and including a main surface; and
a conductor pattern including:
an inner layer pattern provided inside the stacked body;
a mounting electrode provided on the main surface and electrically connected to the inner layer pattern; and
a first auxiliary pattern provided on the main surface and located adjacent to or in a vicinity of the mounting electrode;
the mounting electrode, in a plan view of the main surface, is interposed between a first portion of the first auxiliary pattern, and a second portion of the first auxiliary pattern or a different conductor pattern;
the first auxiliary pattern is not electrically connected to the bonding electrode, and the first auxiliary pattern is electrically independent from the mounting electrode and the inner layer pattern;
the mounting electrode is electrically connected to the bonding electrode and physically bonds the multilayer substrate to the mounting substrate; and
a distance between the mounting electrode and the first auxiliary pattern in a first direction that crosses the mounting electrode and the first auxiliary pattern is smaller than a width of the first auxiliary pattern in the first direction.

11. The multilayer substrate mounting structure according to claim 10, wherein
the mounting substrate includes a portion of the mounting surface on which the bonding electrode is provided;
the portion is a convex portion protruding farther than other portions;
the mounting electrode and the bonding electrode face each other; and
the multilayer substrate and the mounting substrate are connected to each other, and an insulating anisotropic conductive film is interposed between the multilayer substrate and the mounting substrate.

12. A method of manufacturing a multilayer substrate including a stacked body including a plurality of insulating base material layers made of a resin as a main material and stacked on one another, and including a main surface; and a conductor pattern including: an inner layer pattern provided inside the stacked body, a mounting electrode provided on the main surface and electrically connected to the inner layer pattern, and a first auxiliary pattern provided on the main surface, the method comprising:
a conductor pattern forming step of forming the mounting electrode, and the first auxiliary pattern located adjacent to or in a vicinity of the mounting electrode, on a surface of an insulating base material layer defining and functioning as the main surface, among the plurality of insulating base material layers; and
a stacked body forming step of forming the stacked body by stacking the plurality of insulating base material layers and heating and pressing the stacked insulating base material layers, after the conductor pattern forming step, wherein
the mounting electrode is electrically connected to a structure outside of the multilayer substrate and physically bonds the multilayer substrate to the structure;
the mounting electrode is interposed between a first portion of the first auxiliary pattern, and a second portion of the first auxiliary pattern or a different conductor pattern;
the first auxiliary pattern is electrically independent from the mounting electrode and the inner layer pattern; and
a distance between the mounting electrode and the first auxiliary pattern in a first direction that crosses the mounting electrode and the first auxiliary pattern is smaller than a width of the first auxiliary pattern in the first direction.

13. A method of manufacturing an electronic device including a multilayer substrate, and a mounting substrate including a mounting surface, and a bonding electrode on the mounting surface, wherein the multilayer substrate includes a stacked body including a plurality of insulating base material layers made of a resin as a main material and stacked on one another, and including a main surface; and a conductor pattern including an inner layer pattern provided inside the stacked body, a mounting electrode provided on the main surface and electrically connected to the inner layer pattern, and a first auxiliary pattern provided on the main surface and located adjacent to or in a vicinity of the mounting electrode; the mounting electrode, in a plan view of the main surface, is interposed between a first portion of the first auxiliary pattern, and a second portion of the first auxiliary pattern or a different conductor pattern; the first auxiliary pattern is electrically independent from the mounting electrode and the inner layer pattern; and a distance between the mounting electrode and the first auxiliary pattern in a first direction that crosses the mounting electrode and the first auxiliary pattern is smaller than a width of the first auxiliary pattern in the first direction, the method comprising:
- an anisotropic element placing step of placing an insulating anisotropic conductive film on a surface of the bonding electrode being a convex portion protruding farther than at least other portions of the mounting surface;
- a multilayer substrate placing step of stacking the multilayer substrate on the mounting surface of the mounting substrate so that the mounting electrode may face the bonding electrode while interposing the insulating anisotropic conductive film between the multilayer substrate and the mounting substrate, after the anisotropic element placing step; and
- a heating and pressing step of heating and pressing the multilayer substrate and the mounting substrate in a direction in which the multilayer substrate and the mounting substrate are stacked on each other, electrically connecting the mounting electrode and the bonding electrode, and physically bonding the multilayer substrate to the mounting substrate by the mounting electrode, after the multilayer substrate placing step.

14. The multilayer substrate according to claim 1, wherein the first and second portions of the first auxiliary pattern are linear or substantially linear conductor patterns.

15. The multilayer substrate according to claim 1, wherein the inner layer pattern includes a rectangular or substantially rectangular loop-shaped conductor pattern.

16. The multilayer substrate according to claim 1, wherein
- a first end of the inner layer pattern is electrically connected to the mounting electrode; and
- a second end of the inner layer pattern is electrically connected to a second mounting electrode.

17. The multilayer substrate according to claim 1, wherein three out of four directions of the mounting electrode are surrounded by the first auxiliary pattern, the four directions being perpendicular or substantially perpendicular to a radial direction from the mounting electrode.

18. A multilayer substrate comprising:
- a stacked body including a plurality of insulating base material layers made of a resin as a main material and stacked on one another, and including a main surface; and
- a conductor pattern including:
  - an inner layer pattern provided inside the stacked body;
  - a mounting electrode provided on the main surface and electrically connected to the inner layer pattern;
  - a first auxiliary pattern provided on the main surface and located adjacent to or in a vicinity of the mounting electrode; and
  - a second auxiliary pattern provided inside the stacked body and surrounding the inner layer pattern in the plan view of the main surface; wherein
the mounting electrode is electrically connected to a structure outside of the multilayer substrate and physically bonds the multilayer substrate to the structure;
the mounting electrode, in a plan view of the main surface, is interposed between a first portion of the first auxiliary pattern, and a second portion of the first auxiliary pattern or a different conductor pattern;
the first auxiliary pattern is electrically independent from the mounting electrode and the inner layer pattern; and
the inner layer pattern includes a rectangular loop-shaped conductor pattern or a substantially rectangular loop-shaped conductor pattern.

19. A multilayer substrate comprising:
- a stacked body including a plurality of insulating base material layers made of a resin as a main material and stacked on one another, and including a main surface; and
- a conductor pattern including:
  - an inner layer pattern inside the stacked body;
  - a mounting electrode provided on the main surface and electrically connected to the inner layer pattern; and
  - a first auxiliary pattern provided on the main surface and located adjacent to or in a vicinity of the mounting electrode; wherein
the mounting electrode is electrically connected to a structure outside of the multilayer substrate and physically bonds the multilayer substrate to the structure;
the mounting electrode, in a plan view of the main surface, is interposed between a first portion of the first auxiliary pattern, and a second portion of the first auxiliary pattern or a different conductor pattern;
the first auxiliary pattern is electrically independent from the mounting electrode and the inner layer pattern;
no protective layer is provided on the stacked body; and
a portion of the main surface on which the mounting electrode is provided is a convex portion protruding farther than other portions.

20. A multilayer substrate comprising:
- a stacked body including a plurality of insulating base material layers made of a thermoplastic resin as a main material and stacked on one another, and including a main surface; and
- a conductor pattern including:
  - an inner layer pattern provided inside the stacked body;
  - a mounting electrode provided on the main surface and electrically connected to the inner layer pattern; and
  - a first auxiliary pattern provided on the main surface and located adjacent to or in a vicinity of the mounting electrode; wherein
the mounting electrode is electrically connected to a structure outside of the multilayer substrate and physically bonds the multilayer substrate to the structure;
the mounting electrode, in a plan view of the main surface, is interposed between a first portion of the first auxiliary pattern, and a second portion of the first auxiliary pattern or a different conductor pattern; and
the first auxiliary pattern is electrically independent from the mounting electrode and the inner layer pattern.

21. The multilayer substrate according to claim 17, wherein the four directions of the mounting electrode, in the plan view of the main surface, are surrounded by the first auxiliary pattern.

* * * * *